(12) United States Patent
Ueda

(10) Patent No.: US 6,797,532 B2
(45) Date of Patent: Sep. 28, 2004

(54) SEMICONDUCTOR DEVICE AND METHOD FOR MANUFACTURING THE SAME

(75) Inventor: Tetsuzo Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/382,938

(22) Filed: Mar. 7, 2003

(65) Prior Publication Data

US 2004/0079994 A1 Apr. 29, 2004

(30) Foreign Application Priority Data

Mar. 22, 2002 (JP) ........................................ 2002-080229

(51) Int. Cl.⁷ ............................................... H01L 21/00
(52) U.S. Cl. .............................. 438/46; 438/31; 438/47; 438/439; 438/795; 438/796
(58) Field of Search .............................. 438/46, 47, 31, 438/439, 795, 796

(56) References Cited

FOREIGN PATENT DOCUMENTS

JP         11-274082        10/1999

Primary Examiner—Long Pham
(74) Attorney, Agent, or Firm—McDermott Will & Emery LLP

(57) ABSTRACT

A light emitting layer made of a group III-V nitride semiconductor is formed between a first semiconductor layer made of an n-type group III-V nitride semiconductor and a second semiconductor layer made of a p-type group III-V nitride semiconductor. In side portions of the second semiconductor layer, oxidized regions are formed through the oxidization of the second semiconductor layer itself so as to be spaced apart from each other in the direction parallel to the plane of the light emitting layer. A p-side electrode is formed across the entire upper surface of the second semiconductor layer including the oxidized regions, and an n-side electrode is formed on one surface of the first semiconductor layer that is away from the second semiconductor layer.

23 Claims, 22 Drawing Sheets

SEMICONDUCTOR DEVICE AND METHOD FOR MANUFACTURING THE SAME

BACKGROUND OF THE INVENTION

The present invention relates to a semiconductor device such as a short-wavelength light emitting diode device or a short-wavelength semiconductor laser device, and a method for manufacturing the same.

A semiconductor material made of a group III-V nitride semiconductor, having a wide forbidden band, can be used in light emitting devices, specifically, light emitting diode devices and short-wavelength semiconductor laser devices that are capable of emitting light of a color in a visible region such as blue, green or white. Among others, light emitting diode devices have already been in practical use in large-size display apparatuses, traffic signals, etc. Particularly, white light emitting diode devices, which give white light by exciting a fluorescent substance, are expected to replace conventional lighting fixtures such as electric bulbs and fluorescent lamps. Moreover, the development of semiconductor laser devices has reached a point where samples are being shipped and products are being manufactured although in small quantities, for use in high-density, large-capacity optical disk apparatuses using blue-violet laser light.

The crystal growth of a group III-V nitride semiconductor, or a so-called "gallium nitride (GaN) semiconductor", has been difficult, as is also the case with other wide gap semiconductors. However, with the recent significant improvements in crystal growth techniques such as a metal organic chemical vapor deposition method, light emitting diode devices capable of emitting light of short wavelengths such as blue light have already been in practical use.

Moreover, since a substrate made of gallium nitride is difficult to produce, a gallium nitride semiconductor cannot be grown by a crystal growth technique that is used with silicon (Si) or gallium arsenide (GaAs), i.e., growing a semiconductor layer (epitaxial growth layer) on a substrate having the same composition as that of the semiconductor layer. Therefore, a so-called "heteroepitaxial growth process" is typically employed, in which the epitaxial growth layer is grown on a substrate having a different composition from that of the epitaxial growth layer, e.g., a sapphire substrate.

As a result, a gallium nitride semiconductor layer grown on a sapphire substrate is currently exhibiting the most desirable device characteristics, where the crystal defect density of the epitaxial growth layer is about $1 \times 10^7$ cm$^{-2}$. However, since sapphire is insulative, in order to form a device including a p-n junction on a substrate made of sapphire, it is necessary to selectively remove the p-type semiconductor layer or the n-type semiconductor layer after the epitaxial growth and to form a p-type electrode and an n-type electrode on the principal surface of the substrate.

Moreover, since it is typically difficult to perform a wet etching process with an acidic solution, or the like, on a nitride semiconductor, a dry etching method such as reactive ion etching is normally used in such a selective removal step.

First Conventional Example

A method for manufacturing a semiconductor device according to a first conventional example will now be described with reference to the drawings.

FIG. 21 is a cross-sectional view illustrating a light emitting diode device, which is a semiconductor device of the first conventional example.

As illustrated in FIG. 21, first, a buffer layer (not shown) made of gallium nitride or aluminum nitride, an n-type cladding layer 102 made of n-type aluminum gallium nitride, an active layer 103 including a quantum well structure made of undoped indium gallium nitride, and a p-type cladding layer 104 made of p-type aluminum gallium nitride are grown in this order on a substrate 101 made of sapphire by a metal organic chemical vapor deposition method, or the like, to form an epitaxial layer. As a current is externally injected into the n-type cladding layer 102 and the p-type cladding layer 104, electrons and holes are confined in the active layer 103, and output light is produced through recombination of electrons and holes.

Then, the p-type cladding layer 104, the active layer 103 and an upper portion of the n-type cladding layer 102 are selectively etched by a reactive ion etching method to form a current constriction section 200 in the epitaxial layer. Then, the p-side electrode 105 is formed on the p-type cladding layer 104 in the current constriction section 200, and an n-side electrode 106 is formed on the exposed region of the n-type cladding layer 102.

Second Conventional Example

FIG. 22 is a cross-sectional view illustrating a semiconductor laser device, which is a semiconductor device of the second conventional example.

As illustrated in FIG. 22, in order to produce a semiconductor laser device, an upper portion of the current constriction section 200 is again subjected to a reactive ion etching method to form a ridge portion 201 to be a waveguide, and then the p-side electrode 105 is formed in a stripe pattern. Furthermore, the structure is cleaved along a plane perpendicular to the direction in which the p-side electrode 105 having a stripe pattern extends, thereby forming a cavity with the two opposing cleaved surfaces being mirrors. Herein, the upper surface excluding the p-side electrode 105 and the n-side electrode 106 is covered by an insulating film 107 made of silicon oxide.

However, with the methods for manufacturing a semiconductor device of the first and second conventional examples, a nitride semiconductor layer for forming the current constriction section 200 needs to be subjected to a dry etching process. The dry etching process damages the side surfaces of the current constriction section 200. With such a damage, when a current is supplied through the semiconductor device, a leakage current occurs through the damaged portions, thereby increasing the operating current of a light emitting diode device, or the threshold current value of a semiconductor laser device.

Moreover, as described above, sapphire, which is insulative, is used for the substrate 101, whereby both of the p-side electrode 105 and the n-side electrode 106 need to be formed on the principal surface of the substrate 101. This increases the series resistance value as a p-n junction, while increasing the device cost because of an increase in the chip area.

Moreover, sapphire has a relatively small thermal conductivity, and thus a poor heat radiating property. Therefore, when a semiconductor laser device, for example, is produced using sapphire, it is difficult to increase the operating lifetime of the semiconductor laser device.

SUMMARY OF THE INVENTION

In view of these problems in the prior art, a first object of the present invention is to provide a semiconductor device using a group III-V nitride semiconductor, in which a current constriction section can be formed without damaging an exposed surface (side surface) of an active region. Moreover, a second object of the present invention is to reduce the series resistance value and improve the heat radiating property.

In order to achieve the first object, the present invention employs a structure in which a semiconductor layer including an active region is oxidized at positions spaced apart from each other to form oxidized regions so that the oxidized regions form a current constriction section. Moreover, even when the semiconductor layer is dry-etched, the side surface of the current constriction section is oxidized.

Moreover, in order to achieve the second object in addition to the first object, a semiconductor layer is formed on a substrate so that an active region is included in the semiconductor layer, after which the substrate is removed from the semiconductor layer.

Specifically, a semiconductor device of the present invention, which achieves the first object, includes a first semiconductor layer of a first conductivity type and a second semiconductor layer of a second conductivity type, including an active region, wherein at least one of the first semiconductor layer and the second semiconductor layer includes oxidized regions, which are spaced apart from each other in a direction parallel to a plane of the active region and are obtained through oxidization of the at least one of the first semiconductor layer and the second semiconductor layer itself.

With the semiconductor device of the present invention, the oxidized regions are formed so as to be spaced apart from each other in the direction parallel to the plane of the active region, whereby the oxidized regions function as a current constriction structure. Furthermore, the oxidized regions are obtained through oxidization of the first semiconductor layer or the second semiconductor layer itself, whereby it is not necessary to use a dry etching process for the current constriction structure, thus preventing the current constriction structure from being damaged. As a result, it is possible to prevent a leakage current occurring in the active region via a damaged portion.

It is preferred that the semiconductor device of the present invention further includes: a first ohmic electrode formed on the second semiconductor layer; and a second ohmic electrode formed on one side of the first semiconductor layer that is away from the second semiconductor layer. In this way, the second object is achieved.

In the semiconductor device of the present invention, it is preferred that a conductive substrate is provided between the first semiconductor layer and the second ohmic electrode.

In such a case, it is preferred that the conductive substrate is made of silicon carbide, silicon, gallium arsenide, gallium phosphide, indium phosphide, zinc oxide or a metal.

In the semiconductor device of the present invention, it is preferred that the first semiconductor layer and the second semiconductor layer are formed in this order on an insulative substrate, the semiconductor device further including: a first ohmic electrode formed on the second semiconductor layer; and a second ohmic electrode formed on an exposed portion of one surface of the first semiconductor layer that is closer to the second semiconductor layer.

In such a case, it is preferred that the insulative substrate is made of sapphire, magnesium oxide or lithium gallium aluminum oxide ($LiGa_xAl_{1-x}O_2$ (where $0 \leq x \leq 1$)).

In the semiconductor device of the present invention, it is preferred that the oxidized regions are formed so as to include the active region.

In the semiconductor device of the present invention, it is preferred that at least one of the first semiconductor layer and the second semiconductor layer includes a current constriction section formed by removing side portions of the at least one of the first semiconductor layer and the second semiconductor layer.

In such a case, it is preferred that a ridge portion to be a waveguide is formed in an upper portion of the current constriction section.

In the semiconductor device of the present invention, it is preferred that an insulating film is formed on the oxidized regions.

In such a case, it is preferred that the insulating film is made of silicon oxide or silicon nitride.

In the semiconductor device of the present invention, it is preferred that the first semiconductor layer and the second semiconductor layer are made of a compound semiconductor containing nitrogen.

A first method for manufacturing a semiconductor device of the present invention, which achieves the first object, includes: a first step of forming a first semiconductor layer of a first conductivity type; a second step of forming a second semiconductor layer of a second conductivity type on the first semiconductor layer, thereby forming an active region between the first semiconductor layer and the second semiconductor layer; and a third step of selectively oxidizing at least the second semiconductor layer, thereby forming, at least in the second semiconductor layer, oxidized regions spaced apart from each other in a direction parallel to a plane of the active region.

With the first method for manufacturing a semiconductor device, the oxidized regions are formed so as to be spaced apart from each other in the direction parallel to the plane of the active region, whereby the oxidized regions function as a current constriction section. In addition, the oxidized regions are obtained through oxidization of the second semiconductor layer itself, whereby it is not necessary to use a dry etching process for forming the current constriction section, thus preventing an etching damage to the current constriction section. As a result, it is possible to prevent a leakage current occurring in the active region via a damaged portion.

In the first method for manufacturing a semiconductor device, it is preferred that the third step includes a step of selectively covering an upper surface of the second semiconductor layer by a mask film made of a material that is less likely to be oxidized than the second semiconductor layer.

In such a case, it is preferred that the first method for manufacturing a semiconductor device further includes, after the third step, a fourth step of forming an ohmic electrode on the second semiconductor layer after removing the mask film.

It is preferred that the first method for manufacturing a semiconductor device further includes, after the third step: a fourth step of forming a first ohmic electrode on the second semiconductor layer; and a fifth step of forming a second ohmic electrode on one surface of the first semiconductor layer that is away from the active region. In this way, the second object is achieved.

It is preferred that the first method for manufacturing a semiconductor device further includes, after the third step: a fourth step of forming a first ohmic electrode on the second semiconductor layer; and a fifth step of selectively removing the active region and the second semiconductor layer, thereby forming an exposed region of the first semiconductor layer, and forming a second ohmic electrode on the formed exposed region.

In such a case, it is preferred that the fourth step includes: a step of forming an insulating film on the second semiconductor layer including the oxidized regions; a step of forming a resist pattern having an opening corresponding to a portion of the insulating film above the second semiconductor layer, and then etching the insulating film while using the formed resist pattern as a mask, thereby transferring an opening pattern onto the insulating film; and a step of depositing a metal film on the second semiconductor layer including the resist pattern, and lifting off the resist pattern, thereby forming the first ohmic electrode from the metal film.

In the first method for manufacturing a semiconductor device, it is preferred that the insulating film is made of silicon oxide or silicon nitride.

In the first method for manufacturing a semiconductor device, it is preferred that in the first step, the first semiconductor layer is formed on a substrate; and the method further includes, after the third step, a step of separating the substrate from the first semiconductor layer. In this way, the second object is achieved.

In such a case, it is preferred that the first method for manufacturing a semiconductor device further includes, between the second step and the third step, a fourth step of etching at least the second semiconductor layer, thereby forming a current constriction section having a convex cross section at least in the second semiconductor layer.

Moreover, in such a case, it is preferred that in the fourth step, the current constriction section is formed so as to reach the first semiconductor layer.

Alternatively, in such a case, it is preferred that in the fourth step, the current constriction section is formed so as not to reach the active region.

Moreover, in such a case, it is preferred that the fourth step includes a step of forming a ridge portion to be a waveguide in an upper portion of the second semiconductor layer within the current constriction section.

In the first method for manufacturing a semiconductor device, it is preferred that in the third step, the oxidization is performed in an atmosphere containing an oxygen gas or water vapor.

A second method for manufacturing a semiconductor device of the present invention includes: a first step of forming a portion of a first semiconductor layer of a first conductivity type; a second step of selectively oxidizing the portion of the first semiconductor layer, thereby forming, in the portion of the first semiconductor layer, oxidized regions spaced apart from each other in a direction parallel to a plane of the first semiconductor layer; a third step of forming a rest of the first semiconductor layer on the portion of the first semiconductor layer including the oxidized regions; and a fourth step of forming a second semiconductor layer of a second conductivity type on the first semiconductor layer, thereby forming an active region between the first semiconductor layer and the second semiconductor layer.

With the second method for manufacturing a semiconductor device, the oxidized regions to be the current constriction section are formed in a portion of the first semiconductor layer, and then the rest of the first semiconductor layer, the active region and the second semiconductor layer are formed. Therefore, as with the first method for manufacturing a semiconductor device, it is not necessary to use a dry etching process for forming the current constriction section, thus preventing an etching damage to the current constriction section. As a result, it is possible to prevent a leakage current occurring in the active region via a damaged portion.

In the second method for manufacturing a semiconductor device, it is preferred that the second step includes a step of selectively covering an upper surface of the portion of the first semiconductor layer by a mask film made of a material that is less likely to be oxidized than the first semiconductor layer.

In such a case, it is preferred that the second method for manufacturing a semiconductor device further includes: a fifth step of removing the mask film, between the second step and the third step; and a sixth step of forming an ohmic electrode on the second semiconductor layer, after the fourth step.

It is preferred that the second method for manufacturing a semiconductor device further includes, after the fourth step: a fifth step of forming a first ohmic electrode on the second semiconductor layer; and a sixth step of forming a second ohmic electrode on one surface of the first semiconductor layer that is away from the active region.

In the second method for manufacturing a semiconductor device, it is preferred that in the first step, the portion of the first semiconductor layer is formed on a substrate; and the method further includes, after the fourth step, a step of separating the substrate from the first semiconductor layer. In this way, the second object is achieved.

In the second method for manufacturing a semiconductor device, it is preferred that in the second step, the oxidization is performed in an atmosphere containing an oxygen gas or water vapor.

A third method for manufacturing a semiconductor device of the present invention includes: a first step of forming a first semiconductor layer of a first conductivity type; a second step of forming a portion of a second semiconductor layer of a second conductivity type on the first semiconductor layer, thereby forming an active region between the first semiconductor layer and the second semiconductor layer; a third step of selectively oxidizing the first semiconductor layer, the active region and the portion of the second semiconductor layer, thereby forming oxidized regions spaced apart from each other in a direction parallel to a plane of the second semiconductor layer, in the first semiconductor layer, the active region and the portion of the second semiconductor layer; and a fourth step of forming a rest of the second semiconductor layer on the portion of the second semiconductor layer including the oxidized regions.

With the third method for manufacturing a semiconductor device, the oxidized regions to be the current constriction section are formed in the first semiconductor layer, the active region and a portion of the second semiconductor layer, and then the rest of the second semiconductor layer is formed. Therefore, as with the second method for manufacturing a semiconductor device, it is not necessary to use a dry etching process for forming the current constriction section, thus preventing an etching damage to the current constriction section. As a result, it is possible to prevent a leakage current occurring in the active region via a damaged portion.

In the third method for manufacturing a semiconductor device, it is preferred that in the third step, the oxidization is performed in an atmosphere containing an oxygen gas or water vapor.

In the first or second method for manufacturing a semiconductor device, it is preferred that the substrate is made of sapphire, silicon carbide, silicon, gallium arsenide, gallium phosphide, indium phosphide, magnesium oxide, zinc oxide or lithium gallium aluminum oxide ($LiGa_xAl_{1-x}O_2$ (where $0 \leq x \leq 1$)).

In the first or second method for manufacturing a semiconductor device, it is preferred that the substrate separation step includes a step of bonding a support substrate for supporting the second semiconductor layer to an upper surface of the second semiconductor layer.

In such a case, it is preferred that the first or second method for manufacturing a semiconductor device further includes, after the substrate separation step, a step of forming an ohmic electrode on the support substrate.

In such a case, it is preferred that the support substrate is made of silicon, gallium arsenide, gallium phosphide, indium phosphide or a metal.

In the first or second method for manufacturing a semiconductor device, it is preferred that the substrate separation step is performed by a polishing method.

In the first or second method for manufacturing a semiconductor device, it is preferred that the substrate is made of a material whose forbidden band width is larger than that of the first semiconductor layer; the substrate separation step includes a step of irradiating the first semiconductor layer with irradiation light from one surface of the substrate that is away from the first semiconductor layer; and an energy of the irradiation light is smaller than the forbidden band width of the substrate and larger than that of the first semiconductor layer.

Moreover, in the first or second method for manufacturing a semiconductor device, it is preferred that the first semiconductor layer is made of a plurality of semiconductor layers having different compositions; the substrate is made of a material whose forbidden band width is larger than a forbidden band width of one of the plurality of semiconductor layers that has a smallest forbidden band width; the substrate separation step includes a step of irradiating the first semiconductor layer with irradiation light from one surface of the substrate that is away from the first semiconductor layer; and an energy of the irradiation light is smaller than the forbidden band width of the substrate and larger than the forbidden band width of one of the plurality of semiconductor layers that has the smallest forbidden band width.

In such cases, it is preferred that the irradiation light is laser light that oscillates in a pulsed manner.

Alternatively, it is preferred that the irradiation light is an emission line of a mercury lamp.

Moreover, in such a case, it is preferred that the substrate separation step includes a step of heating the substrate.

In the first or second method for manufacturing a semiconductor device, it is preferred that in the substrate separation step, the irradiation light is radiated so as to scan a surface of the substrate.

In the first to third methods for manufacturing a semiconductor device, it is preferred that the first semiconductor layer and the second semiconductor layer are deposited by using one of a metal organic chemical vapor deposition method, a molecular beam epitaxy method and a hydride vapor phase epitaxy method, or by using more than one of the methods in combination.

In the first to third methods for manufacturing a semiconductor device, it is preferred that the first semiconductor layer and the second semiconductor layer are made of a compound semiconductor containing nitrogen.

DETAILED DESCRIPTION OF THE INVENTION

First Embodiment

The first embodiment of the present invention will now be described with reference to the drawings.

Figure 1:
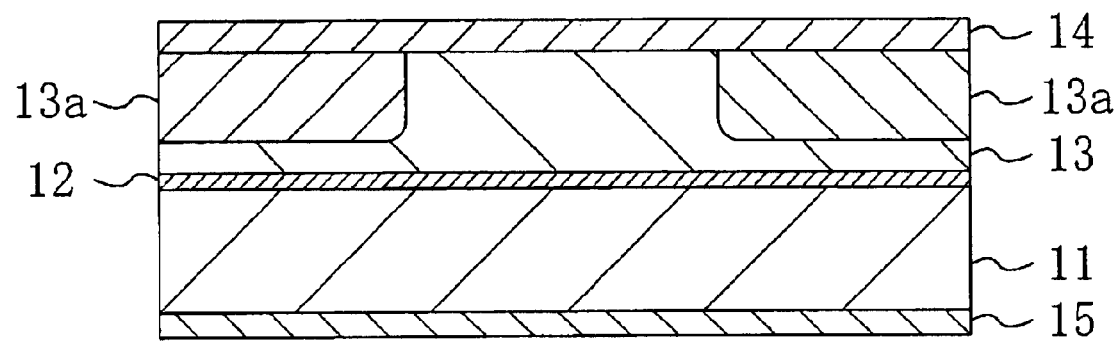
FIG. 1 is a cross-sectional view illustrating a semiconductor device according to a first embodiment of the present invention.

FIG. 1 is a cross-sectional view illustrating, as a semiconductor device according to the first embodiment of the present invention, a semiconductor light emitting device that can be applied to a light emitting diode device or a semiconductor laser device.

As illustrated in FIG. 1, a light emitting layer 12 as an active region made of a group III-V nitride semiconductor is formed between a first semiconductor layer 11 made of an n-type group III-V nitride semiconductor and a second semiconductor layer 13 made of a p-type group III-V nitride semiconductor.

In the opposing side portions of the second semiconductor layer 13, oxidized regions 13a, which are spaced apart from each other in the direction parallel to the plane of the light emitting layer 12, are formed through oxidization of the second semiconductor layer 13 itself.

In the first embodiment, the lower portion of the oxidized regions 13a does not reach the light emitting layer 12. Moreover, in the case of a light emitting diode device, the oxidized region 13a is formed in a ring shape along the periphery of chips, into which the second semiconductor layer 13 is divided. On the other hand, in the case of a semiconductor laser device, it is formed along opposing sides of each chip so as to obtain a cavity structure.

A p-side electrode 14, which is a first ohmic electrode made of a nickel (Ni)-gold (Au) laminate, is formed across the entire surface of the second semiconductor layer 13 including the oxidized regions 13a. Moreover, an n-side electrode 15, which is a second ohmic electrode made of a titanium (Ti)-aluminum (Al) laminate, is formed on one surface of the first semiconductor layer 11 that is away from the second semiconductor layer 13.

Herein, for example, the first semiconductor layer 11 may be an n-type cladding layer made of n-type aluminum gallium nitride (AlGaN) with an n-type gallium nitride (GaN) layer being provided on the side of the n-side electrode 15, and the second semiconductor layer 13 may be a p-type cladding layer made of p-type aluminum gallium nitride with a p-type gallium nitride layer being provided on the side of the p-side electrode 14. Moreover, the light emitting layer 12 may have a quantum well structure using indium gallium nitride (InGaN) in the well layer.

Furthermore, a contact layer made of gallium nitride, for example, may be provided on the inner side of each of the n-side electrode 15 and the p-side electrode 14.

Note that the oxidized regions 13a may alternatively be provided in the first semiconductor layer 11 instead of in the second semiconductor layer 13.

Moreover, the upper surface of the oxidized regions 13a and that of the second semiconductor layer 13 do not have to be flush with each other.

Moreover, the conductivity type of the first semiconductor layer 11 and that of the second semiconductor layer 13 may be exchanged.

As described above, the semiconductor device of the first embodiment does not have a single-crystal substrate for growing the first semiconductor layer 11, the light emitting layer 12 and the second semiconductor layer 13, whereby the p-side electrode 14 and the n-side electrode 15 are provided so as to oppose each other via the light emitting layer 12 therebetween. Thus, it is possible to significantly reduce the series resistance value between the p-side electrode 14 and the n-side electrode 15. In addition, the oxidized regions 13a, which are spaced apart from each other in the direction parallel to the plane of the light emitting layer 12, form a current constriction section without being dry-etched. Therefore, side portions of the light emitting layer 12 are not subject to an etching damage, whereby it is possible to significantly reduce the leakage current in the light emitting layer 12 during the operation of the device. As a result, it is possible to reliably reduce the operating current of a light emitting diode device, or the threshold current value of a semiconductor laser device.

Moreover, as described above, the device does not have a substrate made of sapphire, which is normally used, whereby the semiconductor layers 11 and 13 including the light emitting layer 12 can be cleaved in the orientation that is inherent to a gallium nitride semiconductor without being bound by the orientation of sapphire. As a result, in the case of a semiconductor laser device, a cavity having a desirable cleaved surface can be obtained, whereby improvements in the operating characteristics of the device can be achieved, such as a reduction in the threshold current value.

First Manufacturing Method of First Embodiment

A method for manufacturing a semiconductor device having such a structure will be described with reference to the drawings.

FIG. 2A to FIG. 2E are cross-sectional views sequentially illustrating steps in a first method for manufacturing a semiconductor device according to the first embodiment of the present invention.

Figure 2A:
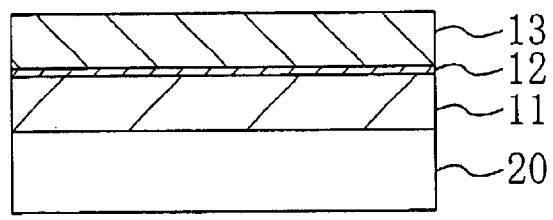
FIG. 2A to FIG. 2E are cross-sectional views sequentially illustrating steps in a first method for manufacturing a semiconductor device according to the first embodiment of the present invention.

First, as illustrated in FIG. 2A, the first semiconductor layer 11, which is an n-type cladding layer made of n-type aluminum gallium nitride, the light emitting layer 12 containing indium gallium nitride, and the second semiconductor layer 13, which is a p-type cladding layer made of p-type aluminum gallium nitride, are grown in this order on a substrate 20 made of sapphire (single-crystal $Al_2O_3$) by a metal organic chemical vapor deposition (MOCVD) method, for example. Herein, a portion of the first semiconductor layer 11 in the vicinity of the interface with the substrate 20 may be made of gallium nitride so that the portion serves as a contact layer for the n-side electrode. Similarly, a portion of the second semiconductor layer 13 in the vicinity of the upper surface thereof may be made of gallium nitride so that the portion serves as a contact layer for the p-side electrode.

Moreover, for example, trimethylgallium (TMGa), trimethylaluminum (TMAl) and trimethylindium (TMIn) are used as a group III source, and ammonia ($NH_3$) is used as a nitrogen source. Moreover, the n-type dopant may be a monosilane ($SiH_4$) gas, for example, and the p-type dopant may be biscyclopentadienyl magnesium ($Cp_2Mg$), for example.

Figure 2B:
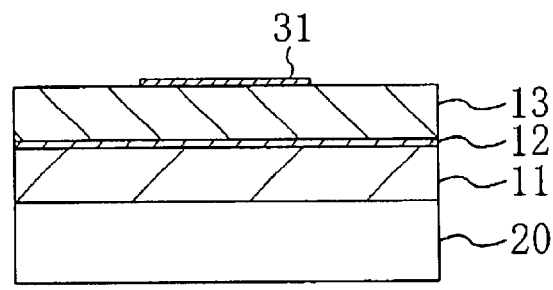

Next, as illustrated in FIG. 2B, a mask-forming film made of silicon (Si) obtained through decomposition of monosilane (SiH$_4$) is deposited on the second semiconductor layer 13 by a chemical vapor deposition (CVD) method, for example, and an oxidization mask film 31 is formed from the deposited mask-forming film by a photolithography method and a dry etching method. In the case of a light emitting diode device, the oxidization mask film 31 is arranged in the central portion so that a peripheral portion of the device (chip), i.e., the second semiconductor layer 13, is exposed. Moreover, in the case of a semiconductor laser device, it is arranged in a stripe pattern along the current constriction section of the second semiconductor layer 13.

Figure 2C:
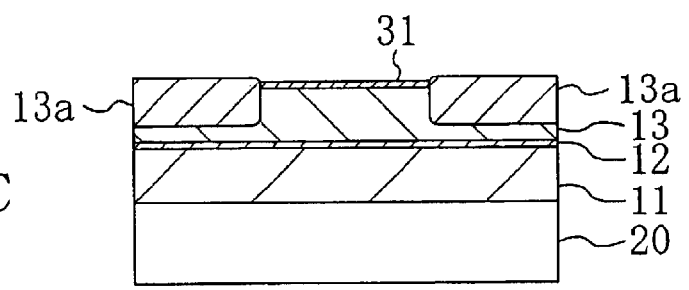

Next, as illustrated in FIG. 2C, the second semiconductor layer 13 with the oxidization mask film 31 formed thereon is subjected to a heat treatment at a temperature of 900° C. for about 4 hours, for example, in an oxidizing atmosphere containing an oxygen (O$_2$) gas, for example. Herein, the oxidizing atmosphere may be water vapor (H$_2$O). Thus, the oxidized regions 13$a$, which are spaced apart from each other in the direction parallel to the plane of the light emitting layer 12, are formed in the second semiconductor layer 13. Thus, by using an oxygen gas or water vapor as the oxidizing atmosphere, it is possible to form the oxidized regions 13$a$ within a short period of time and, with a good reproducibility.

Figure 2D:
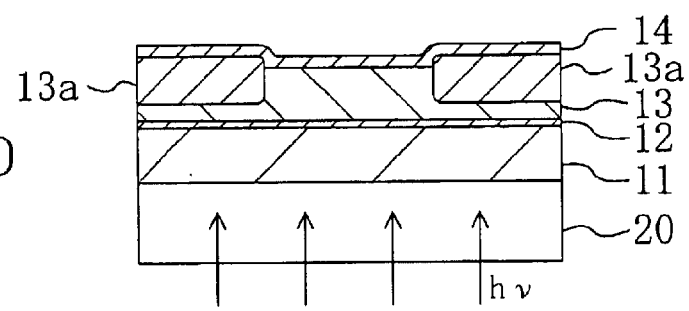

Next, as illustrated in FIG. 2D, the oxidization mask film 31 is removed by hydrofluoric-nitric acid, for example, and then the p-side electrode 14 made of a nickel-gold laminate is formed across the entire surface of the second semiconductor layer 13 including the oxidized regions 13$a$ by using an electron beam deposition method, for example. Then, one surface of the substrate 20 that is away from the first semiconductor layer 11 is irradiated with krypton fluoride (KrF) pulsed excimer laser light having a wavelength of 248 nm so as to scan the entire surface of the substrate 20. Thus, the radiated excimer laser light is not absorbed by the substrate 20 but is absorbed by the first semiconductor layer 11, whereby the first semiconductor layer 11 is heated. This heat thermally decomposes gallium nitride, whereby the substrate 20 and the first semiconductor layer 11 are separated from each other. Herein, the peak power density and the pulse width of the excimer laser light are set so that gallium nitride bound to the substrate 20 is decomposed. Thus, by oscillating excimer laser light in a pulsed manner, the output power of the laser light can be increased significantly, whereby the substrate 20 can easily be separated from the first semiconductor layer 11. In addition, since the excimer laser light is radiated so as to scan the surface of the substrate 20, the substrate 20 can reliably be separated even if the substrate 20 has a relatively large area, irrespective of the beam diameter of the light source.

Moreover, the substrate 20 may be irradiated with excimer laser light while heating the substrate 20 to a temperature of about 500° C. so as to relieve the stress that occurs during the cooling process after the crystal growth due to the difference between the coefficient of thermal expansion of a nitride semiconductor and that of sapphire.

Moreover, the irradiation light may alternatively be the tertiary harmonic wave of YAG (Yttrium Aluminum Garnet) laser having a wavelength of 355 nm, or the emission line of a mercury (Hg) lamp having a wavelength of 365 nm, instead of KrF excimer laser light.

For example, when the emission line of a mercury lamp is used, although the optical output power is less than that of a laser system, the spot size can be made larger, whereby the substrate 20 can be separated within a shorter period of time.

Furthermore, the substrate 20 may be separated from the first semiconductor layer 11 by methods other than irradiation with light, including removal of the substrate 20 by a polishing method.

Herein, when the light irradiation method is used as a method for separating the substrate 20, the separation can be done with a reduced damage to the first semiconductor layer 11, and the separation can be done easily even if the substrate 20 is warped. On the other hand, when a polishing method is used, the manufacturing cost can be reduced because the need for a light source such as a laser system is eliminated.

Figure 2E:
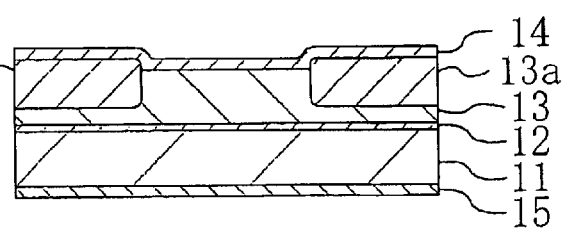

Next, as illustrated in FIG. 2E, the n-side electrode 15 made of a titanium-aluminum laminate is formed on one surface of the first semiconductor layer 11 that is away from the light emitting layer 12 by an electron beam deposition method, for example.

Second Manufacturing Method of First Embodiment

A second manufacturing method of the first embodiment of the present invention will now be described with reference to the drawings.

FIG. 3A to FIG. 3E are cross-sectional views sequentially illustrating steps in the second method for manufacturing a semiconductor device according to the first embodiment of the present invention. While the deposition process of the first manufacturing method starts from the first semiconductor layer 11, the deposition process of the second manufacturing method proceeds in the reverse order, starting from the second semiconductor layer 13. In FIG. 3A to FIG. 3E, those components that are already shown in FIG. 2A to FIG. 2E are denoted by the same reference numerals.

Figure 3A:
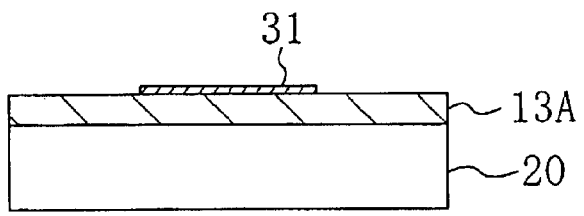
FIG. 3A to FIG. 3E are cross-sectional views sequentially illustrating steps in a second method for manufacturing a semiconductor device according to the first embodiment of the present invention.

First, as illustrated in FIG. 3A, a lower second semiconductor layer 13A made of p-type aluminum gallium nitride is grown on the substrate 20 by an MOCVD method. Then, the oxidization mask film 31 made of silicon is selectively formed on the lower second semiconductor layer 13A in a manner similar to that of the first manufacturing method.

Figure 3B:
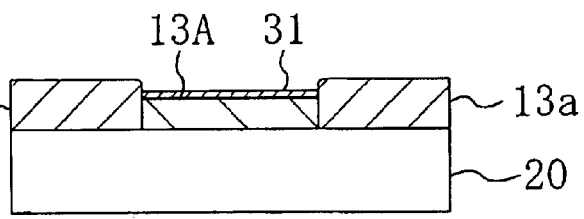

Next, as illustrated in FIG. 3B, the lower second semiconductor layer 13A with the oxidization mask film 31 formed thereon is subjected to a heat treatment at a temperature of 900° C. for about 4 hours, for example, in an oxidizing atmosphere containing an oxygen gas or water vapor. Thus, the oxidized regions 13$a$, which are spaced apart from each other in the direction parallel to the substrate surface, are formed in the lower second semiconductor layer 13A.

Figure 3C:
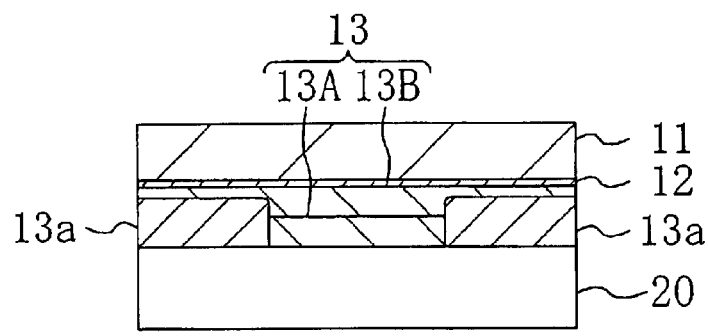

Next, as illustrated in FIG. 3C, the oxidization mask film 31 is removed by hydrofluoric-nitric acid, for example, and then the upper second semiconductor layer 13B made of p-type aluminum gallium nitride, the light emitting layer 12 and the first semiconductor layer 11 made of n-type aluminum gallium nitride are grown in this order on the lower second semiconductor layer 13A again by an MOCVD method. Herein, the lower second semiconductor layer 13A and the upper second semiconductor layer 13B are collectively referred to as the second semiconductor layer 13. Moreover, the composition of a portion of the lower second semiconductor layer 13A in the vicinity of the substrate 20 may be gallium nitride, and the composition of a portion of the first semiconductor layer 11 in the vicinity of the upper surface thereof may be gallium nitride.

Figure 3D:
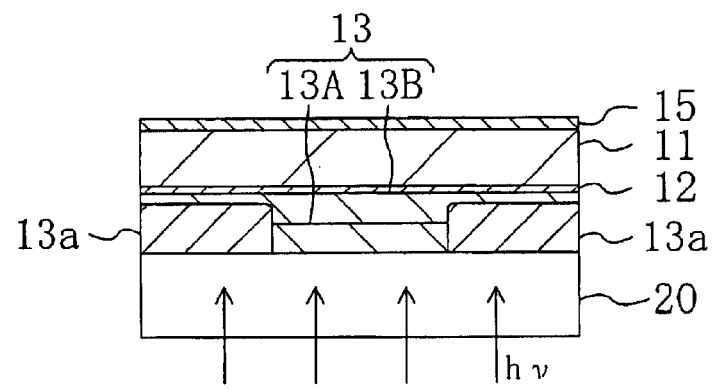

Next, as illustrated in FIG. 3D, the n-side electrode 15 made of a titanium-aluminum laminate is formed through a vapor deposition process on the first semiconductor layer 11. Then, one surface of the substrate 20 that is away from the lower second semiconductor layer 13A is irradiated with KrF excimer laser light so as to scan the entire surface of the substrate 20, thereby separating the substrate 20 from the second semiconductor layer 13. Herein, it is preferred that the laser light oscillates in a pulsed manner, and it is preferred that the substrate 20 is heated to a temperature of about 500° C. while being irradiated with the laser light. Moreover, the separation/removal of the substrate 20 may be done by using the emission line of a mercury lamp or by a polishing method.

Figure 3E:
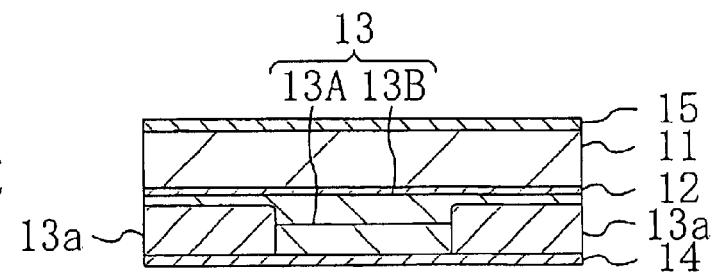

Next, as illustrated in FIG. 3E, the p-side electrode 14 made of a nickel-gold laminate is formed on one surface of the second semiconductor layer 13 that is away from the light emitting layer 12.

Note that while an MOCVD method is used as the crystal growth method for the semiconductor layers 11 and 13 including the light emitting layer 12 in the first manufacturing method and the second manufacturing method, a molecular beam epitaxy (MBE) method may alternatively be used at least for the growth of the light emitting layer 12.

Furthermore, a portion of the first semiconductor layer 11 and the second semiconductor layer 13 may be deposited by a hydride vapor phase epitaxy (HVPE) method.

An HVPE method has a growth rate of 100 μm/h or more, which is considerably higher than those of an MOCVD method and an MBE method, it is possible to easily increase the thickness of the first and second semiconductor layers 11 and 13. Moreover, by increasing the thickness of the semiconductor layers 11 and 13, the handling of the substrate 20 in the form of a wafer after the deposition process is made easier. In addition, improvements in the crystallinity can also be expected from the high-speed growth process. Therefore, a growth layer grown by an HVPE method and having a thickness of 10 μm or more, for example, may be included in at least one of the first semiconductor layer 11 and the second semiconductor layer 13.

Therefore, in a case where the light emitting layer 12 includes a quantum well structure, if the light emitting layer 12 is deposited by an MOCVD method or an MBE method, with which a multi-layer structure made of films that are as thin as a few atoms can be controlled easily and reproducibly, improvements in the operating characteristics of a semiconductor laser device can be achieved, such as a reduction in the threshold current value. Moreover, when the semiconductor layers 11 and 13 are deposited by an HVPE method having a high growth rate, it is easy to increase the thickness thereof. Therefore, the device structure including a quantum well structure can be formed efficiently, whereby it is possible to obtain a semiconductor device having desirable operating characteristics at a low cost.

Moreover, the material of the oxidization mask film 31 for selectively forming the oxidized regions 13a is not limited to silicon, but may alternatively be any other material that is less likely to be oxidized as compared with a gallium nitride semiconductor, e.g., silicon nitride ($Si_3N_4$).

First Variation of First Embodiment

A first variation of the first embodiment of the present invention will now be described with reference to the drawings.

Figure 4A:
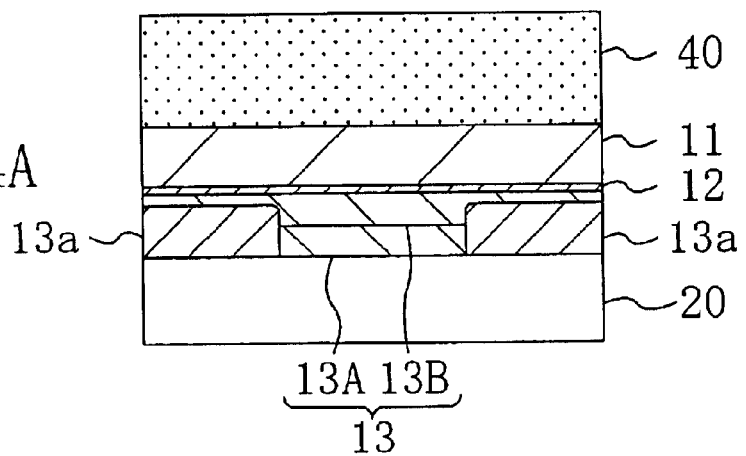
FIG. 4A to FIG. 4C are cross-sectional views sequentially illustrating steps in a method for manufacturing a semiconductor device according to a first variation of the first embodiment of the present invention.
Figure 4B:
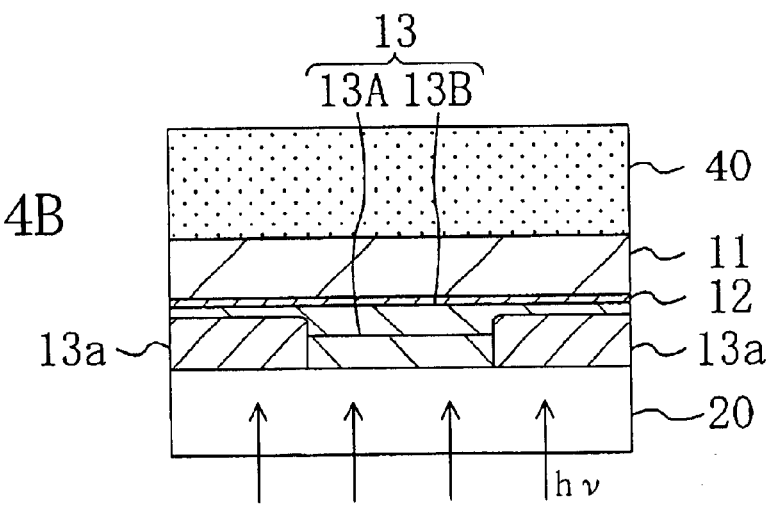
Figure 4C:
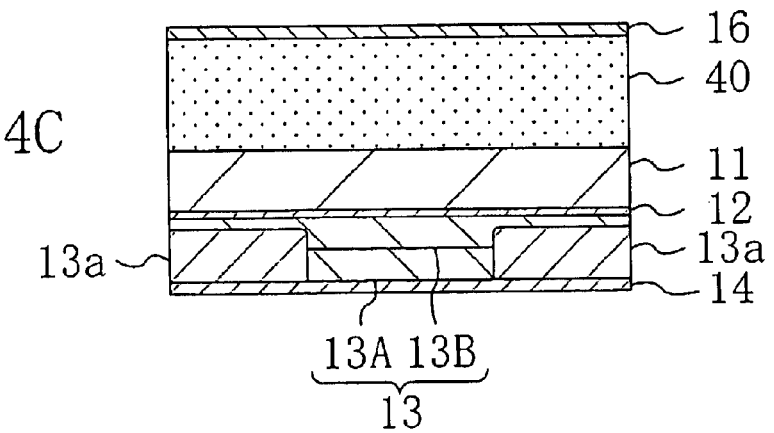

FIG. 4A to FIG. 4C are cross-sectional views sequentially illustrating steps in a method for manufacturing a semiconductor device according to the first variation of the first embodiment of the present invention.

First, as illustrated in FIG. 4A, the second semiconductor layer 13, the oxidized regions 13a, the light emitting layer 12 and the first semiconductor layer 11 are formed on the substrate 20 made of sapphire, and then a support substrate 40 made of n-type silicon (Si) oriented along the (100) plane is bonded to the upper surface of the first semiconductor layer 11 by a known bonding method. In this process, if the support substrate 40 is bonded so that the cleaved surface of the support substrate 40 and that of the first semiconductor layer 11 are parallel to each other, it is possible to easily and reliably cleave the semiconductor layers 11 and 13 including the support substrate 40.

Next, as illustrated in FIG. 4B, one surface of the substrate 20 that is away from the lower second semiconductor layer 13A is irradiated with pulsed KrF excimer laser light so as to scan the entire surface of the substrate 20, thereby separating the substrate 20 from the second semiconductor layer 13. Herein, the separation/removal of the substrate 20 may be done by using the emission line of a mercury lamp or by a polishing method.

Next, as illustrated in FIG. 4C, an n-side electrode 16 made of an alloy of gold (Au) and antimony (Sb) (an Au—Sb alloy) is formed on the upper surface of the first semiconductor layer 11. Then, the p-side electrode 14 made of a nickel-gold laminate is formed on one surface of the second semiconductor layer 13 that is away from the light emitting layer 12.

Note that if the support substrate 40 made of a material having a better heat radiating property than that of the substrate 20, e.g., copper (Cu), is bonded, the heat radiating property of the semiconductor device is further improved.

Note that the material of the support substrate 40 is not limited to silicon, but may alternatively be gallium arsenide (GaAs), gallium phosphide (GaP) or indium phosphide (InP). Thus, where the semiconductor device is a semiconductor laser device, for example, it is possible to reduce the threshold current value and to increase the operating lifetime of the device.

Moreover, the conductivity type of the first semiconductor layer 11 and that of the second semiconductor layer 13 may be switched around.

Second Variation of First Embodiment

A second variation of the first embodiment of the present invention will now be described with reference to the drawings.

Figure 5:
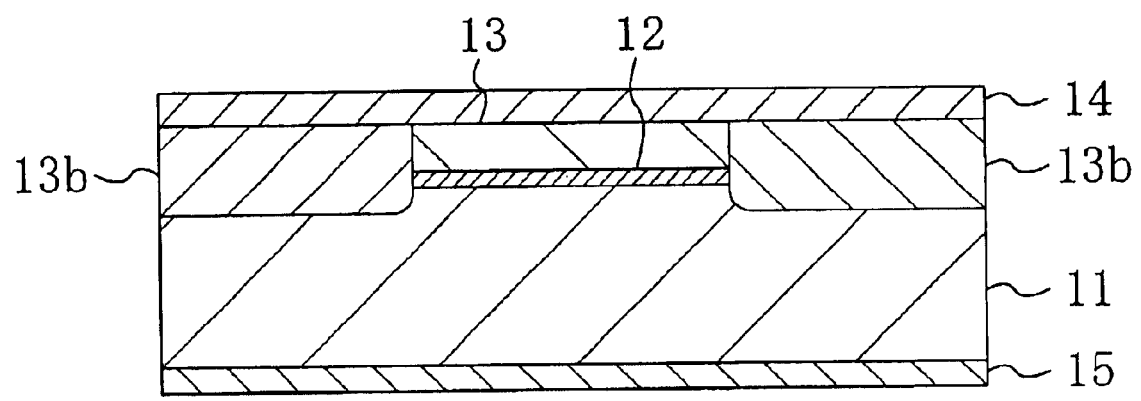
FIG. 5 is a cross-sectional view illustrating a semiconductor device according to a second variation of the first embodiment of the present invention.

FIG. 5 is a cross-sectional view illustrating a semiconductor device according to the second variation of the first embodiment of the present invention. In FIG. 5, those components that are already shown in FIG. 1 are denoted by the same reference numerals, and will not be further described below.

As illustrated in FIG. 5, oxidized regions 13b of the semiconductor device of the second variation are formed so as to include the light emitting layer 12 and an upper portion of the n-type first semiconductor layer 11. Thus, the externally injected current can be constricted more reliably, thereby further reducing the leakage current in the light emitting layer 12.

With the first manufacturing method, the oxidized regions 13b can be formed by growing the structure up to the second semiconductor layer 13, and then oxidizing the structure until the oxidized regions 13b reach the upper portion of the first semiconductor layer 11. Moreover, with the second manufacturing method, the oxidized regions 13b can be formed by growing the p-type second semiconductor layer 13, the light emitting layer 12 and a (lower) portion the n-type first semiconductor layer 11, and then selectively oxidizing these growth layers. Then, the rest of the first semiconductor layer 11 can be re-grown.

Note that the conductivity type of the first semiconductor layer 11 and that of the second semiconductor layer 13 may be switched around.

Moreover, in the first embodiment and the variation thereof, a single-crystal substrate of magnesium oxide (MgO) or lithium gallium aluminum oxide (LiGa$_x$Al$_{1-x}$O$_2$ (where $0 \leq x \leq 1$)) may be used for the substrate 20, instead of sapphire. Since a single-crystal substrate of these materials has a lattice constant close to that of a group III-V nitride semiconductor, a nitride semiconductor crystal grows desirably on such a substrate, whereby it is possible to realize a high-performance light emitting device, i.e., a light emitting diode device or a semiconductor laser device, capable of emitting visible light such as blue light or blue-violet light.

Also in the second variation, the upper surface of the oxidized regions 13a and that of the second semiconductor layer 13 do not have to be flush with each other.

Second Embodiment

The second embodiment of the present invention will now be described with reference to the drawings.

Figure 6:
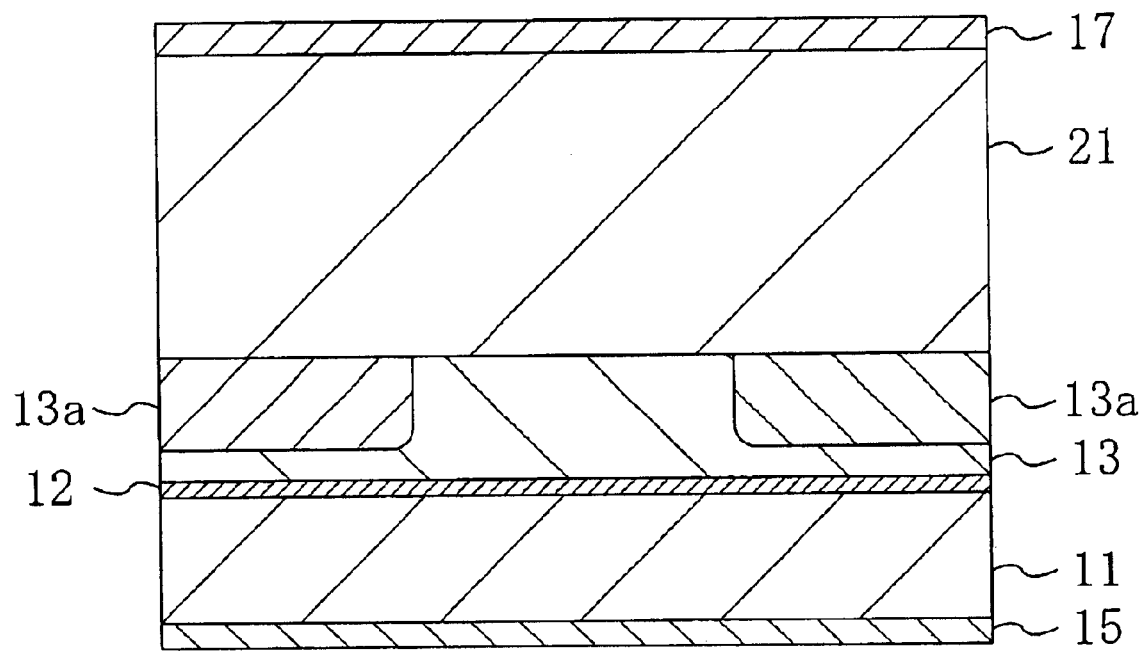
FIG. 6 is a cross-sectional view illustrating a semiconductor device according to a second embodiment of the present invention.

FIG. 6 is a cross-sectional view illustrating, as a semiconductor device according to the second embodiment of the present invention, a semiconductor light emitting device that can be applied to a light emitting diode device or a semiconductor laser device. In FIG. 6, those components that are already shown in FIG. 1 are denoted by the same reference numerals, and will not be further described below.

In the semiconductor device of the second embodiment, a substrate 21 made of p-type silicon carbide (SiC) oriented along the (0001) plane, for example, is provided on one surface of the p-type second semiconductor layer 13 that is away from the light emitting layer 12.

Moreover, a p-side electrode 17 as the first ohmic electrode made of an alloy of aluminum (Al) and silicon (Si), e.g., an Al—Si alloy (Al: 89%), is formed on one surface of the substrate 21 that is away from the second semiconductor layer 13.

Thus, according to the second embodiment, the substrate 21, which is electrically conductive, is provided on the second semiconductor layer 13, whereby the p-side electrode 17 and the n-side electrode 15 can be formed so as to oppose each other via the light emitting layer 12 therebetween. Thus, it is possible to significantly reduce the series resistance value between the p-side electrode 17 and the n-side electrode 15. In addition, the oxidized regions 13a, which are spaced apart from each other in the direction parallel to the plane of the light emitting layer 12, form a current constriction section without being dry-etched. Therefore, side portions of the light emitting layer 12 are not subject to an etching damage, whereby it is possible to significantly reduce the leakage current in the light emitting layer 12 during the operation of the device. As a result, it is possible to reduce the operating current of a light emitting diode device or the threshold current value of a semiconductor laser device.

Furthermore, since silicon carbide, which has a better heat radiating property than that of sapphire is used for the substrate 21, it is possible to further increase the operating lifetime of the semiconductor device.

Note that the upper surface of the oxidized regions 13a and that of the second semiconductor layer 13 do not have to be flush with each other.

Moreover, the conductivity type of the first semiconductor layer 11 and that of the second semiconductor layer 13 may be switched around.

Moreover, the extent of the oxidized regions 13a is not limited to within the second semiconductor layer 13, but the oxidized regions 13a may alternatively be formed so as to reach the light emitting layer 12 or the first semiconductor layer 11.

Moreover, the material of the substrate 21 may alternatively be silicon (Si), gallium arsenide (GaAs), gallium phosphide (GaP), indium phosphide (InP), zinc oxide (ZnO) or a metal such as copper (Cu), instead of silicon carbide. Since zinc oxide, for example, has a lattice constant close to that of a group III-V nitride semiconductor, and any of silicon, gallium arsenide, gallium phosphide and indium phosphide has a desirable crystallinity, a nitride semiconductor crystal grows desirably on such a substrate, whereby it is possible to realize a high-performance light emitting device, i.e., a light emitting diode device or a semiconductor laser device, capable of emitting visible light such as blue light or blue-violet light.

Moreover, when using a metal, a desirable heat radiating property is obtained. Therefore, in the case of a semiconductor laser device, for example, the semiconductor laser device can operate under high temperatures, and the operating lifetime of the semiconductor laser device can be increased.

A method for manufacturing a semiconductor device having such a structure will now be described with reference to the drawings.

FIG. 7A to FIG. 7D are cross-sectional views sequentially illustrating steps in a method for manufacturing a semiconductor device according to the second embodiment of the present invention.

Herein, a method in which the second semiconductor layer 13, the light emitting layer 12 and the first semiconductor layer 11 are deposited in this order on the substrate 21, as in the second manufacturing method of the first embodiment, will be described.

Figure 7A:
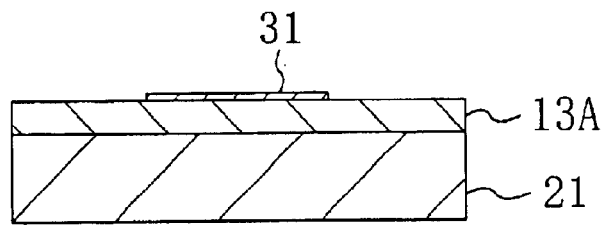
FIG. 7A to FIG. 7D are cross-sectional views sequentially illustrating steps in a method for manufacturing a semiconductor device according to the second embodiment of the present invention.

First, as illustrated in FIG. 7A, the lower second semiconductor layer 13A made of p-type aluminum gallium nitride is grown on the substrate 21 made of p-type silicon carbide by an MOCVD method. Then, the oxidization mask film 31 made of silicon is selectively formed on the lower second semiconductor layer 13A, as in the first embodiment.

Figure 7B:
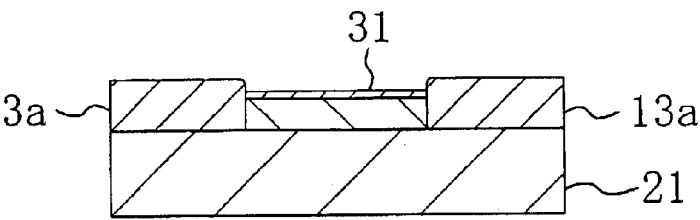

Next, as illustrated in FIG. 7B, the lower second semiconductor layer 13A with the oxidization mask film 31 formed thereon is subjected to a heat treatment at a temperature of 900° C. for about 4 hours, for example, in an oxidizing atmosphere containing an oxygen gas or water vapor. Thus, the oxidized regions 13a, which are spaced apart from each other in the direction parallel to the substrate surface, are formed in the lower second semiconductor layer 13A.

Figure 7C:
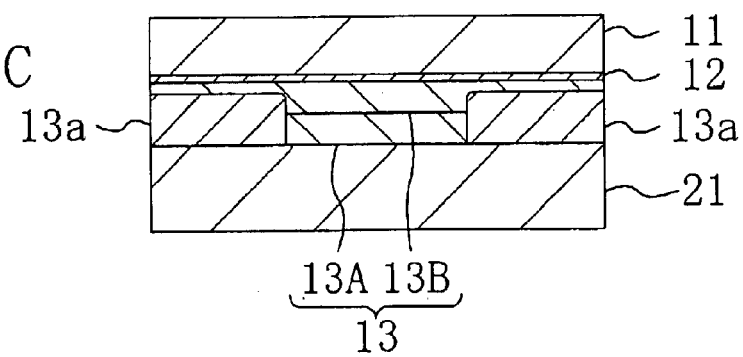

Next, as illustrated in FIG. 7C, the oxidization mask film 31 is removed by hydrofluoric-nitric acid, for example, and then the upper second semiconductor layer 13B made of p-type aluminum gallium nitride, the light emitting layer 12 and the first semiconductor layer 11 made of n-type aluminum gallium nitride are grown in this order on the lower second semiconductor layer 13A again by an MOCVD method. Again, the lower second semiconductor layer 13A and the upper second semiconductor layer 13B are collectively referred to as the second semiconductor layer 13. Moreover, the composition of a portion of the lower second semiconductor layer 13A in the vicinity of the substrate 21 may be gallium nitride, and the composition of a portion of the first semiconductor layer 11 in the vicinity of the upper surface thereof may be gallium nitride.

Figure 7D:
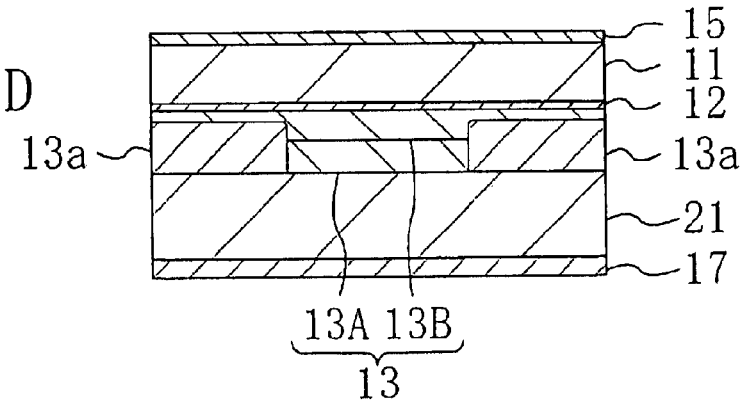

Next, as illustrated in FIG. 7D, the n-side electrode 15 made of a titanium-aluminum laminate is formed across the entire surface of the first semiconductor layer 11 by an electron beam deposition method, for example. Then, the p-side electrode 17 made of an Al—Si alloy (Al: 89%) is formed on one surface of the substrate 21 that is away from the lower second semiconductor layer 13A by an electron beam deposition method, for example.

Note that while an MOCVD method is used as the crystal growth method for the semiconductor layers 11 and 13 including the light emitting layer 12, an MBE method may alternatively be used at least for the deposition of the light emitting layer 12.

Furthermore, a growth layer grown by an HVPE method and having a thickness of 10 μm or more, for example, may be included in at least one of the first semiconductor layer 11 and the second semiconductor layer 13.

Thus, in the manufacturing method of the second embodiment, the substrate 21 for growing semiconductor layers thereon is electrically conductive, whereby the n-side electrode 15 and the p-side electrode 17 can be provided so as to oppose each other without removing the substrate 21, thus simplifying the process.

Third Embodiment

The third embodiment of the present invention will now be described with reference to the drawings.

Figure 8:
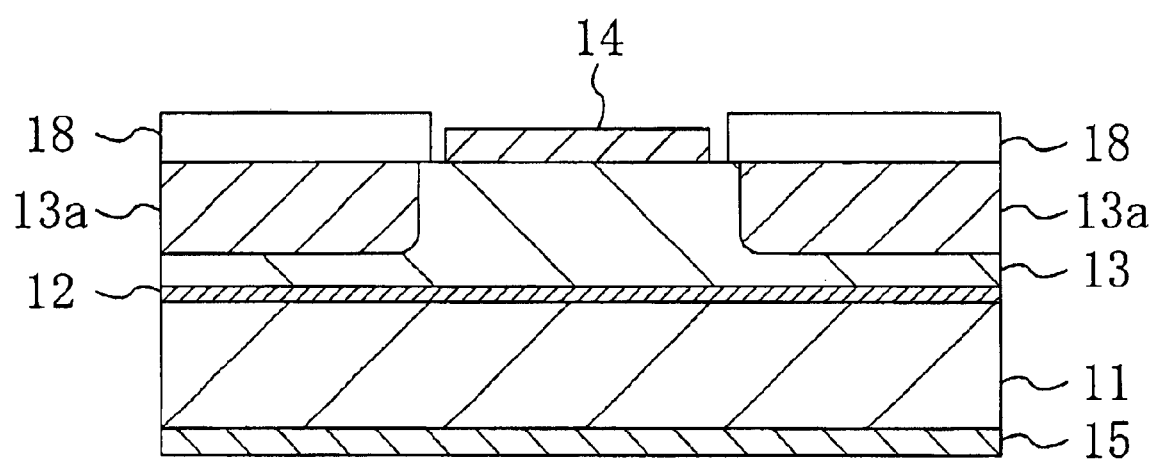
FIG. 8 is a cross-sectional view illustrating a semiconductor device according to a third embodiment of the present invention.

FIG. 8 is a cross-sectional view illustrating, as a semiconductor device according to the third embodiment of the present invention, a semiconductor light emitting device that can be applied to a light emitting diode device or a semiconductor laser device. In FIG. 8, those components that are already shown in FIG. 1 are denoted by the same reference numerals, and will not be further described below.

The semiconductor device of the third embodiment is characterized in that the exposed surfaces of the oxidized regions 13a, which form the current constriction section, are covered by an insulating film 18 made of silicon oxide (SiO$_2$). Moreover, the p-side electrode 14 is selectively formed on a region of the second semiconductor layer 13 between the oxidized regions 13a.

Thus, as in the first embodiment, the semiconductor device of the third embodiment does not have a substrate for crystal growth, whereby the p-side electrode 14 and the n-side electrode 15 are provided so as to oppose each other via the light emitting layer 12 therebetween. Thus, it is possible to significantly reduce the series resistance value between the p-side electrode 14 and the n-side electrode 15. In addition, the oxidized regions 13a, which are spaced apart from each other in the direction parallel to the plane of the light emitting layer 12, form a current constriction section without being dry-etched. Therefore, side portions of the light emitting layer 12 are not subject to an etching damage.

In addition, the position of the p-side electrode 14 is restricted by the insulating film 18, and the p-side electrode 14 is formed only on the exposed surface of the second semiconductor layer 13. Therefore, a leakage current via the oxidized regions 13a can be prevented, whereby it is possible to further suppress the leakage current in the light emitting layer 12 during the operation of the device. As a result, it is possible to reduce the operating current of the semiconductor device.

Moreover, the device does not have a substrate for crystal growth, whereby the semiconductor layers 11 and 13 including the light emitting layer 12 can be cleaved in the orientation that is inherent to a gallium nitride semiconductor without being bound by the orientation of the material of the substrate. Therefore, in the case of a semiconductor laser device, a cavity having a desirable cleaved surface can be realized, whereby improvements in the operating characteristics of the device can be achieved, such as a reduction in the threshold current value.

Note that the oxidized regions 13a may alternatively be provided in the first semiconductor layer 11 instead of in the second semiconductor layer 13.

Moreover, the upper surface of the oxidized regions 13a and that of the second semiconductor layer 13 do not have to be flush with each other.

Moreover, the conductivity type of the first semiconductor layer 11 and that of the second semiconductor layer 13 may be switched around.

Moreover, the extent of the oxidized regions 13a is not limited to within the second semiconductor layer 13, but the oxidized regions 13a may alternatively be formed so as to reach the light emitting layer 12 or the first semiconductor layer 11.

A method for manufacturing a semiconductor device having such a structure will now be described with reference to the drawings.

FIG. 9A to FIG. 9D and FIG. 10A to FIG. 10D are cross-sectional views sequentially illustrating steps in a method for manufacturing a semiconductor device according to the third embodiment of the present invention.

Herein, a method in which layers are sequentially deposited on the substrate 20 starting from the first semiconductor layer 11, as in the first manufacturing method of the first embodiment, will be described.

Figure 9A:
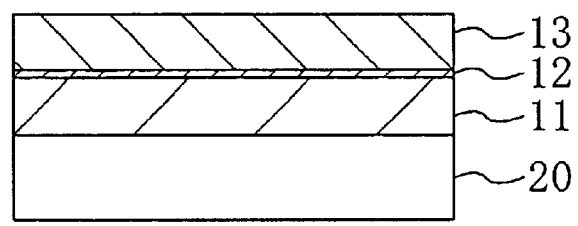
FIG. 9A to FIG. 9D are cross-sectional views sequentially illustrating steps in a method for manufacturing a semiconductor device according to the third embodiment of the present invention.

First, as illustrated: in FIG. 9A, the first semiconductor layer 11 made of n-type aluminum gallium nitride, the light emitting layer 12 including indium gallium nitride in the well layer, and the second semiconductor layer 13 made of p-type aluminum gallium nitride are grown in this order on the substrate 20 made of sapphire by an MOCVD method, for example. Herein, a portion of the first semiconductor layer 11 in the vicinity of the interface with the substrate 20 may be made of gallium nitride so that the portion serves as a contact layer for the n-side electrode. Similarly, a portion of the second semiconductor layer 13 in the vicinity of the upper surface thereof may be made of gallium nitride so that the portion serves as a contact layer for the p-side electrode.

Figure 9B:
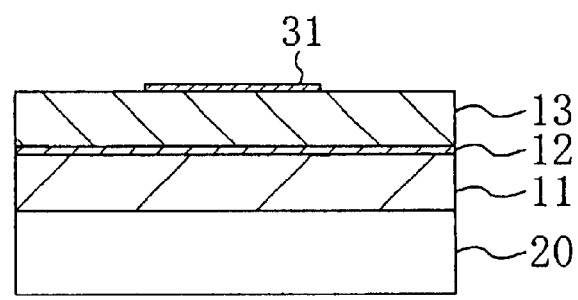

Next, as illustrated in FIG. 9B, the oxidization mask film 31 made of silicon is selectively formed on the second semiconductor layer 13 as in the first embodiment.

Figure 9C:
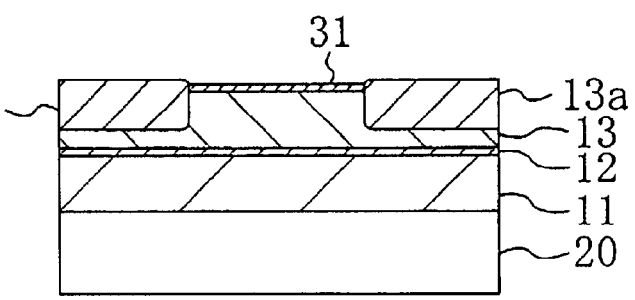

Next, as illustrated in FIG. 9C, the second semiconductor layer 13 with the oxidization mask film 31 formed thereon is subjected to a heat treatment at a temperature of 900° C. for about 4 hours, for example, in an oxidizing atmosphere containing an oxygen gas or water vapor. Thus, the oxidized regions 13a, which are spaced apart from each other in the direction parallel to the plane of the light emitting layer 12, are formed in the second semiconductor layer 13.

Figure 9D:
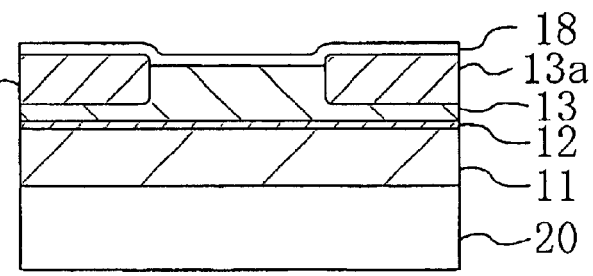

Next, as illustrated in FIG. 9D, the insulating film 18 made of silicon oxide and having a thickness of about 300 nm is deposited across the entire upper surface of the second semiconductor layer 13 including the oxidized regions 13a by a CVD method.

Figure 10A:
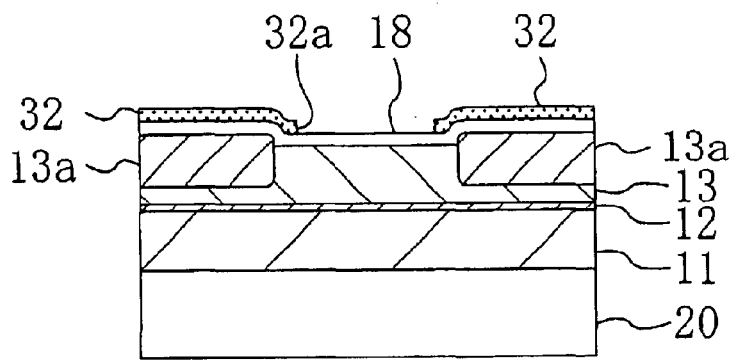
FIG. 10A to FIG. 10D are cross-sectional views sequentially illustrating steps in a method for manufacturing a semiconductor device according to the third embodiment of the present invention.

Next, as illustrated in FIG. 10A, a resist pattern 32 having an opening pattern 32a in the electrode forming region above a portion of the second semiconductor layer 13 that is interposed between the oxidized regions 13a is formed on the insulating film 18 by a photolithography method.

Figure 10B:
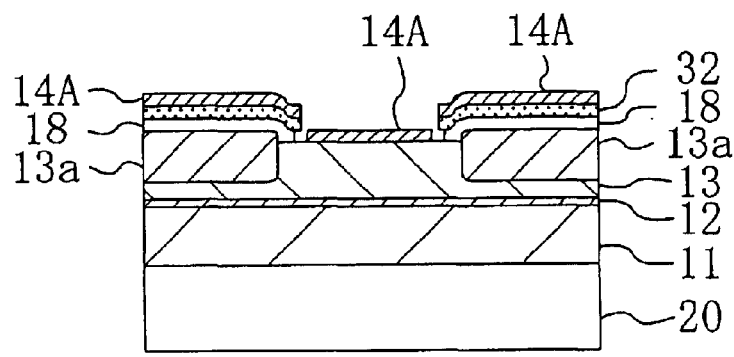

Next, as illustrated in FIG. 10B, the insulating film 18 is wet-etched with, for example, an aqueous solution including hydrofluoric acid (HF) (hereinafter referred to as "hydrofluoric acid") while using the resist pattern 32 as a mask. Thus, the opening pattern 32a is transferred onto the insulating film 18 so as to expose a portion of the second semiconductor layer 13 that is interposed between the oxidized regions 13a. Then, a p-side electrode forming film 14A made of a nickel-gold laminate is deposited through a vapor deposition process on the resist pattern 32 including the second semiconductor layer 13.

Figure 10C:
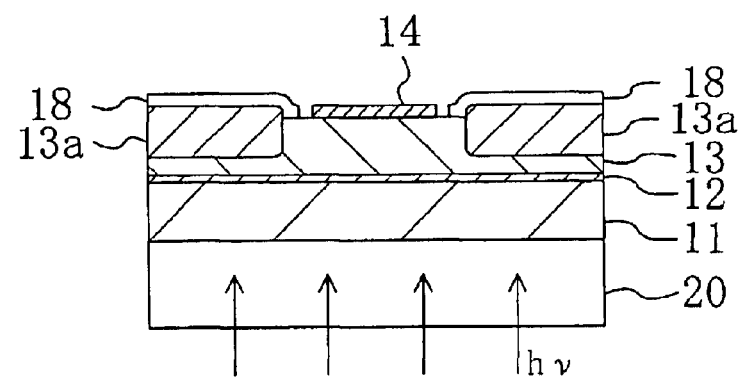

Next, as illustrated in FIG. 10C, the p-side electrode 14 made of the p-side electrode forming film 14A is formed on a portion of the second semiconductor layer 13 that is interposed between the oxidized regions 13a by a so-called "lift-off" method for removing the resist pattern 32. Then, one surface of the substrate 20 that is away from the first semiconductor layer 11 is irradiated with pulsed KrF excimer laser light so as to scan the entire surface of the substrate 20. The irradiation with laser light thermally decomposes a portion of the first semiconductor layer 11 that is along the interface with the substrate 20, thereby separating the substrate 20 and the first semiconductor layer 11 from each other. Herein, the substrate 20 may be heated to a temperature of about 500° C. while being irradiated with the laser light. Moreover, the means for separating or removing the substrate 20 may alternatively be the tertiary harmonic wave of YAG laser having a wavelength of 355 nm, the emission line of a mercury lamp having a wavelength of 365 nm, or a polishing method, instead of KrF excimer laser light.

Figure 10D:
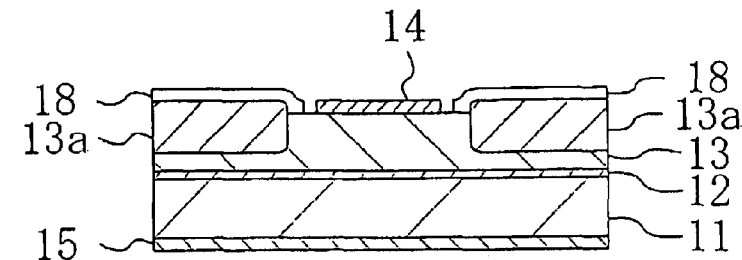

Next, as illustrated in FIG. 10D, the n-side electrode 15 made of a titanium-aluminum laminate is formed through a vapor deposition process on one surface of the first semiconductor layer 11 that is away from the light emitting layer 12.

Thus, according to the manufacturing method of the third embodiment, the insulating film 18 not only functions as a surface protection film for the oxidized regions 13a, but also functions as a spacer layer, in the step of depositing the p-side electrode forming film 14A illustrated in FIG. 10B, for separating a portion of the p-side electrode forming film 14A that is located on the resist pattern 32 and another portion thereof that is located on the second semiconductor layer 13 from each other.

Thus, the insulating film 18 is provided on the oxidized regions 13a, and the p-side electrode 14 is formed so that the position thereof is restricted by the insulating film 18, whereby the production yield of the p-side electrode 14 is improved, thus reducing the cost, in addition to the reduction in the leakage current as described above.

Note that while silicon oxide is used for the insulating film 18, silicon nitride ($Si_3N_4$) may alternatively be used instead of silicon oxide. Silicon oxide and silicon nitride can easily be removed by wet etching, and can be formed at a relatively low temperature. Therefore, thermal damage to the light emitting layer 12 can be suppressed, whereby the operating characteristics of the semiconductor device will not be deteriorated. In addition, the p-side electrode forming film 14A can be lifted off easily and reproducibly.

Moreover, the second manufacturing method may also be employed, in which layers are grown on the substrate 20 starting from the second semiconductor layer 13.

Moreover, a support substrate made of silicon, or the like, may be bonded to one surface of the second semiconductor layer 13 that is away from the light emitting layer 12 before the substrate 20 is separated from the first semiconductor layer 11, e.g., before the insulating film 18 is deposited. Alternatively, a support substrate made of silicon, or the like, may be bonded to one surface of the first semiconductor layer 11 that is away from the light emitting layer 12 after the separation of the substrate 20 and before the formation of the n-side electrode 15.

Fourth Embodiment

The fourth embodiment of the present invention will now be described with reference to the drawings.

Figure 11:
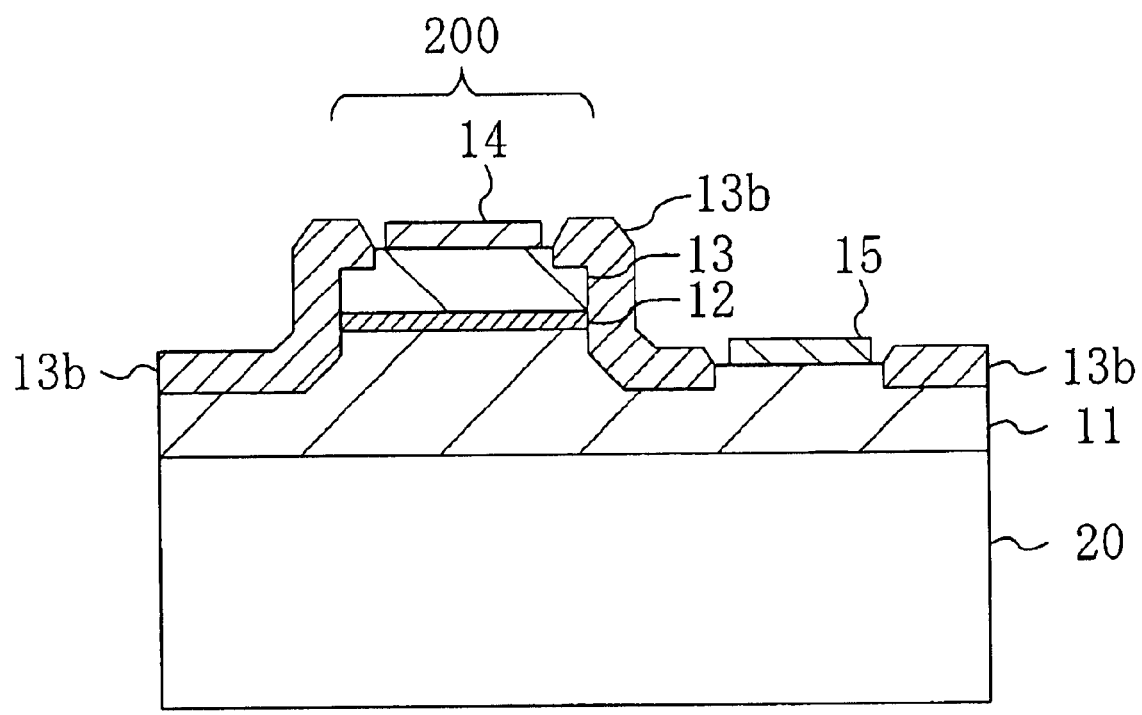
FIG. 11 is a cross-sectional view illustrating a semiconductor device according to a fourth embodiment of the present invention.

FIG. 11 is a cross-sectional view illustrating, as a semiconductor device according to the fourth embodiment of the present invention, a semiconductor light emitting device that can be applied to a light emitting diode device. In FIG. 11, those components that are already shown in FIG. 1 are denoted by the same reference numerals, and will not be further described below.

In the semiconductor device of the fourth embodiment, sapphire, which is insulative, is used for the substrate 20 on which the n-type first semiconductor layer 11, the light emitting layer 12 and the p-type second semiconductor layer 13 are to be grown, and the substrate 20 is not separated from the first semiconductor layer 11.

Therefore, a current constriction section 200, which is etched so that it has a convex cross section, is formed in the first semiconductor layer 11 and the second semiconductor layer 13 including the light emitting layer 12. The p-side electrode 14, which is the first ohmic electrode, is formed on the second semiconductor layer 13 in the current constriction section 200, and the n-side electrode 15, which is the second ohmic electrode, is formed on the exposed region of the first semiconductor layer 11 beside the current constriction section 200.

Furthermore, the fourth embodiment is characterized in that the oxidized regions 13b are formed on the exposed surface of the current constriction section 200, which has been exposed by dry etching, or the like. The oxidized regions 13b are formed through oxidization of the semiconductor layers 11 and 13, themselves, including the light emitting layer 12 so as to interpose the light emitting layer 12 therebetween.

Thus, according to the fourth embodiment, even with a structure where the current constriction section 200 is provided by dry etching, or the like, as in the prior art, the exposed surface of the current constriction section 200 including the side portions of the light emitting layer 12 is oxidized to form the oxidized regions 13b. Thus, even if the exposed surface of the current constriction section 200 is damaged by etching, the damaged portion is oxidized and taken into the oxidized regions 13b. As a result, the leakage current in the light emitting layer 12 is significantly reduced, whereby the operating current of the semiconductor device can be reduced.

Note that the conductivity type of the first semiconductor layer 11 and that of the second semiconductor layer 13 may be switched around.

Moreover, the first semiconductor layer 11, the light emitting layer 12 and the second semiconductor layer 13 may be formed by an MOCVD method or an MBE method, for example, and a portion grown by an HVPE method to a thickness of 10 $\mu$m or more can be included in at least one of the first semiconductor layer 11 and the second semiconductor layer 13.

Moreover, a single-crystal substrate made of magnesium oxide or lithium gallium aluminum oxide ($LiGa_xAl_{1-x}O_2$ (where $0 \leq x \leq 1$)) may be used for the substrate 20, instead of sapphire.

Fifth Embodiment

The fifth embodiment of the present invention will now be described with reference to the drawings.

Figure 12:
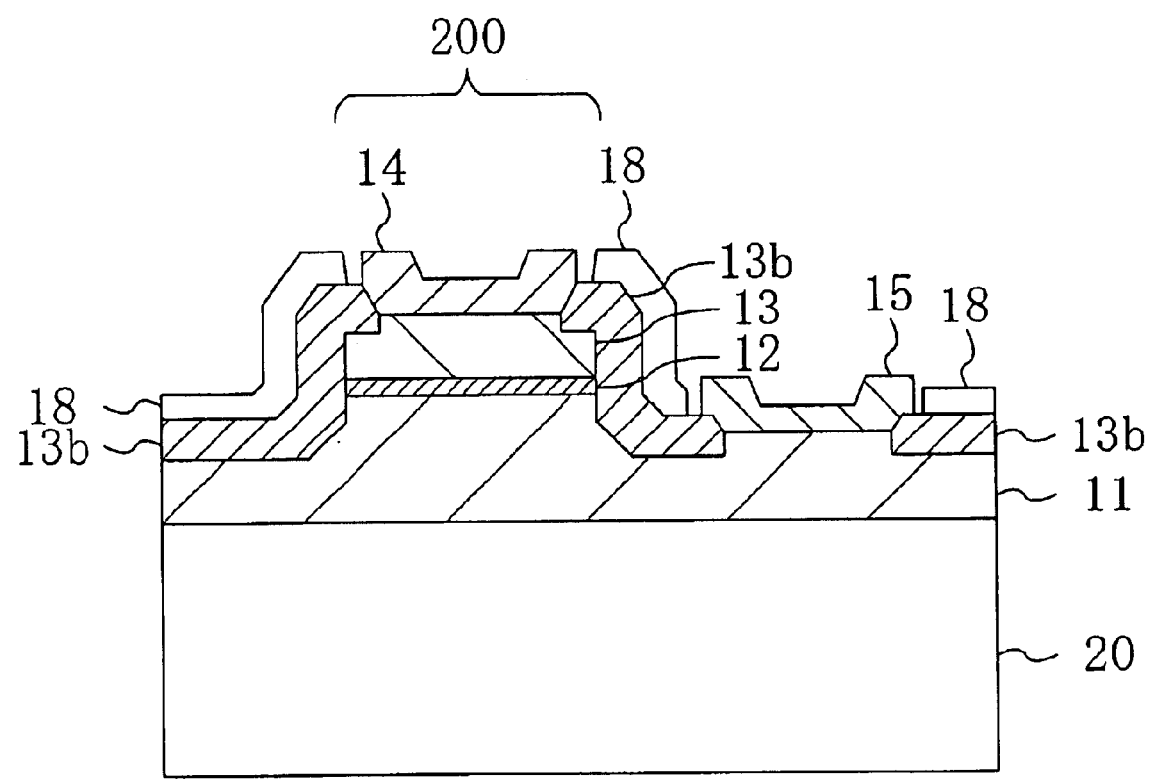
FIG. 12 is a cross-sectional view illustrating a semiconductor device according to a fifth embodiment of the present invention.

FIG. 12 is a cross-sectional view illustrating, as a semiconductor device according to the fifth embodiment of the present invention, a semiconductor light emitting device that can be applied to a light emitting diode device. In FIG. 12, those components that are already shown in FIG. 11 are denoted by the same reference numerals, and will not be further described below.

In the semiconductor device of the fifth embodiment, the insulating film 18 made of silicon oxide as a surface protection film is formed on the exposed surface of the oxidized regions 13b.

Moreover, the edge portions of the p-side electrode 14 and the n-side electrode 15 are formed so as to be laid on the edge portions of the oxidized regions 13b.

Note that the conductivity type of the first semiconductor layer 11 and that of the second semiconductor layer 13 may be switched around.

Moreover, a single-crystal substrate made of magnesium oxide or lithium gallium aluminum oxide ($LiGa_xAl_{1-x}O_2$ (where $0 \leq x \leq 1$)) may be used for the substrate 20, instead of sapphire.

A method for manufacturing a semiconductor device having such a structure will now be described with reference to the drawings.

FIG. 13A to FIG. 13D and FIG. 14A to FIG. 14D are cross-sectional views sequentially illustrating steps in a method for manufacturing a semiconductor device according to the fifth embodiment of the present invention.

Figure 13A:
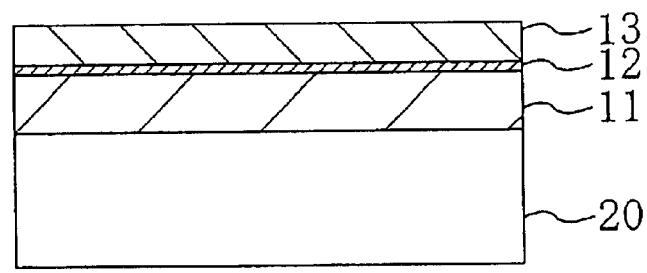
FIG. 13A to FIG. 13D are cross-sectional views sequentially illustrating steps in a method for manufacturing a semiconductor device according to the fifth embodiment of the present invention.

First, as illustrated in FIG. 13A, the first semiconductor layer 11 made of n-type aluminum gallium nitride, the light emitting layer 12 including indium gallium nitride in the well layer, and the second semiconductor layer 13 made of p-type aluminum gallium nitride are grown in this order on the substrate 20 made of sapphire by an MOCVD method, for example. Herein, a portion of the first semiconductor layer 11 in the vicinity of the interface with the substrate 20 may be made of gallium nitride. Similarly, a portion of the second semiconductor layer 13 in the vicinity of the upper surface thereof may be made of gallium nitride.

Figure 13B:
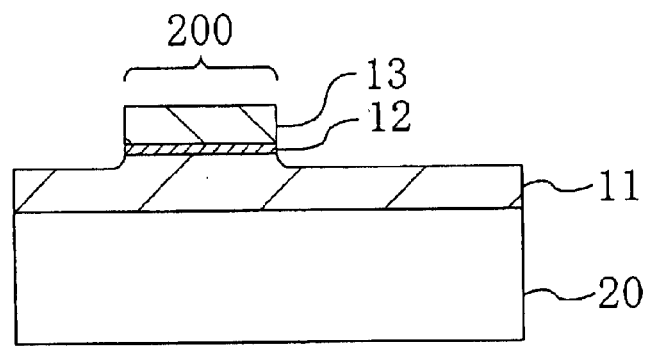

Next, as illustrated in FIG. 13B, the second semiconductor layer 13, the light emitting layer 12 and an upper portion of the first semiconductor layer 11 are sequentially dry-etched, while masking a current constriction section forming region of the second semiconductor layer 13, by a reactive ion etching (RIE) method using a chlorine ($Cl_2$) gas as an etching gas, for example, thereby forming the current constriction section 200 having a convex cross section and including the first semiconductor layer 11, the light emitting layer 12 and the second semiconductor layer 13.

Figure 13C:
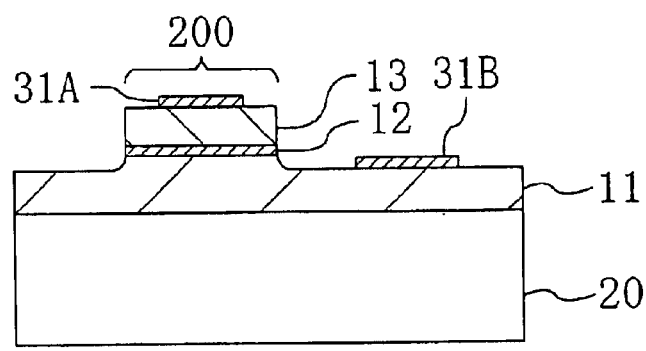

Next, as illustrated in FIG. 13C, a mask-forming film made of silicon is deposited on the entire upper surface of the first semiconductor layer 11 including the current constriction section 200 by, for example, a CVD method in which monosilane is decomposed. Then, a first oxidization mask film 31A is formed, from the mask-forming film, on a portion of the second semiconductor layer 13 within the current constriction section 200 for masking the portion of the second semiconductor layer 13 excluding the peripheral portion thereof, by a photolithography method and an etching method. At the same time, a second oxidization mask film 31B is formed, from the mask-forming film, on the exposed region of the first semiconductor layer 11 beside the current constriction section 200.

Herein, in the step illustrated in FIG. 13B, if the etching process is performed by using the first oxidization mask film 31A as a mask, instead of using a resist mask, or the like, the photolithography step illustrated in FIG. 13B can be omitted.

Figure 13D:
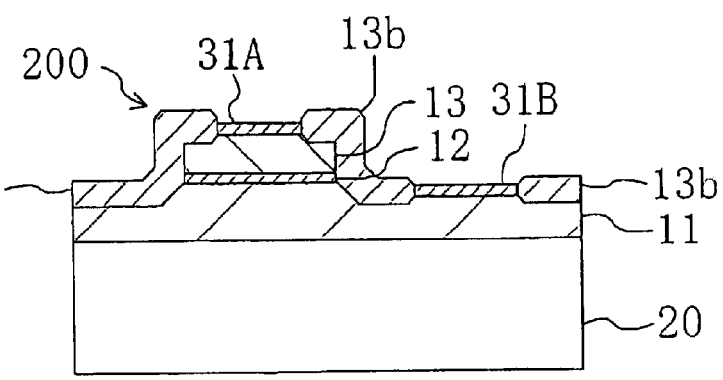

Next, as illustrated in FIG. 13D, the substrate 20 with the first oxidization mask film 31A and the second oxidization mask film 31B formed thereon is subjected to a heat treatment at a temperature of about 900° C. for about 4 hours in an oxidizing atmosphere containing an oxygen gas or water vapor. Thus, the oxidized regions 13b are formed on the surface of the current constriction section 200 and on the exposed surface of the first semiconductor layer 11.

Figure 14A:
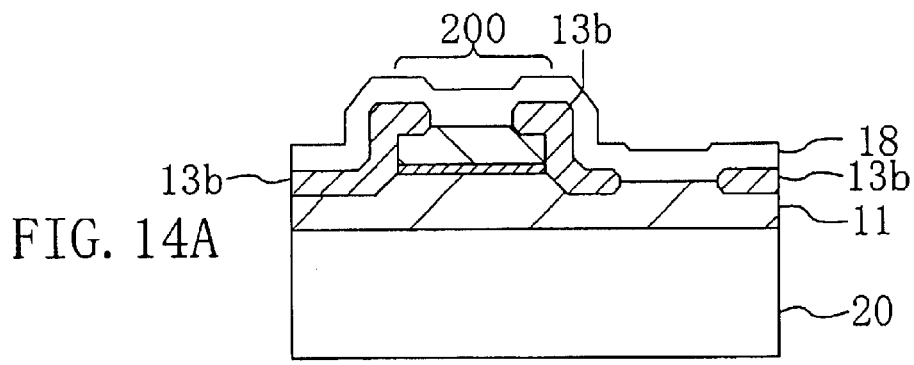
FIG. 14A to FIG. 14D are cross-sectional views sequentially illustrating steps in the method for manufacturing a semiconductor device according to the fifth embodiment of the present invention.

Next, as illustrated in FIG. 14A, the first oxidization mask film 31A and the second oxidization mask film 31B are removed by hydrofluoric-nitric acid, for example. Then, the insulating film 18 made of silicon oxide and having a thickness of about 300 nm is deposited across the entire surface of the substrate 20 including the current constriction section 200 by a CVD method.

Figure 14B:
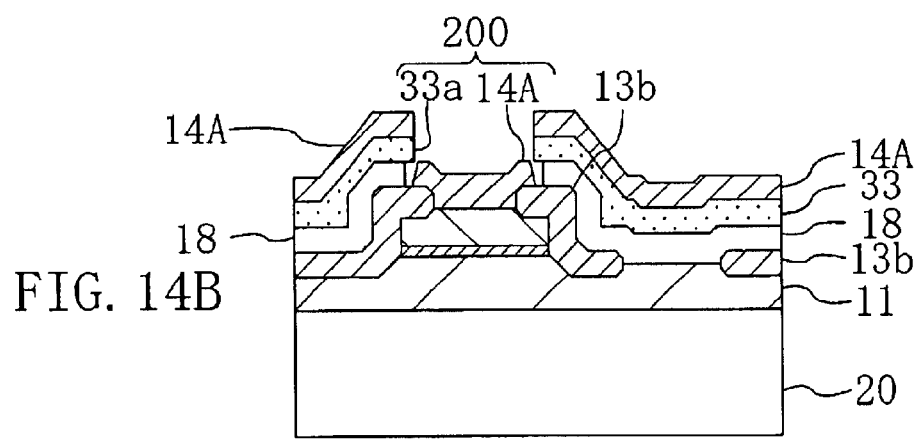

Next, as illustrated in FIG. 14B, a first resist pattern 33 having a first opening pattern 33a in the p-side electrode forming region above a portion of the second semiconductor layer 13 within the current constriction section 200 is formed on the insulating film 18 by a photolithography method. Then, the insulating film 18 is wet-etched with, for example, hydrofluoric acid while using the first resist pattern 33 as a mask. Thus, the first opening pattern 33a is transferred onto the insulating film 18 so as to expose the second semiconductor layer 13. Then, the p-side electrode forming film 14A made of a nickel-gold laminate is deposited through a vapor deposition process on the first resist pattern 33 including the exposed portion of the second semiconductor layer 13. Then, the p-side electrode 14 made of the p-side electrode forming film 14A is formed on a portion of the second semiconductor layer 13 within the current constriction section 200 by a so-called "lift-off" method for removing the first resist pattern 33. Herein, since the edge portions of the oxidized regions 13b are exposed through the first opening pattern 33a, the edge portions of the formed p-side electrode 14 are laid on the edge portions of the oxidized regions 13b.

Figure 14C:
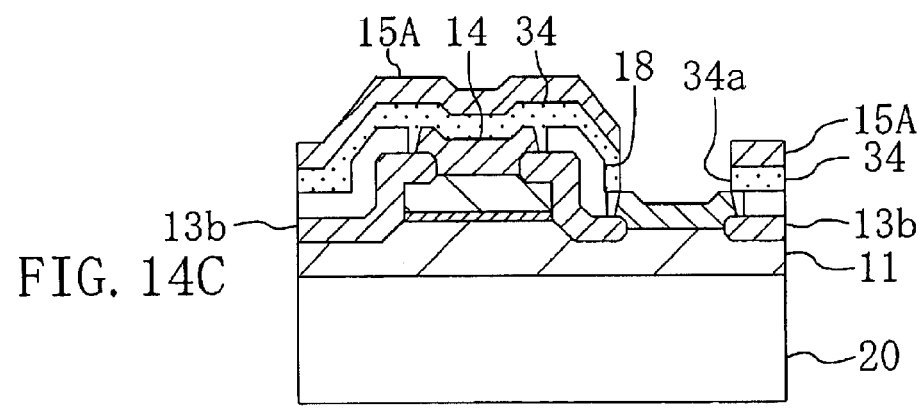

Next, as illustrated in FIG. 14C, a second resist pattern 34 having a second opening pattern 34a in the n-side electrode forming region above a portion of the first semiconductor layer 11 beside the current constriction section 200 is formed on the insulating film 18 and the p-side electrode 14 again by a photolithography method. Then, the insulating film 18 is wet-etched with, for example, hydrofluoric acid while using the second resist pattern 34 as a mask. Thus, the second opening pattern 34a is transferred onto the insulating film 18 so as to expose the first semiconductor layer 11. Then, an n-side electrode forming film 15A made of a titanium-aluminum laminate is deposited through a vapor deposition process on the second resist pattern 34 including the exposed portion of the first semiconductor layer 11.

Figure 14D:
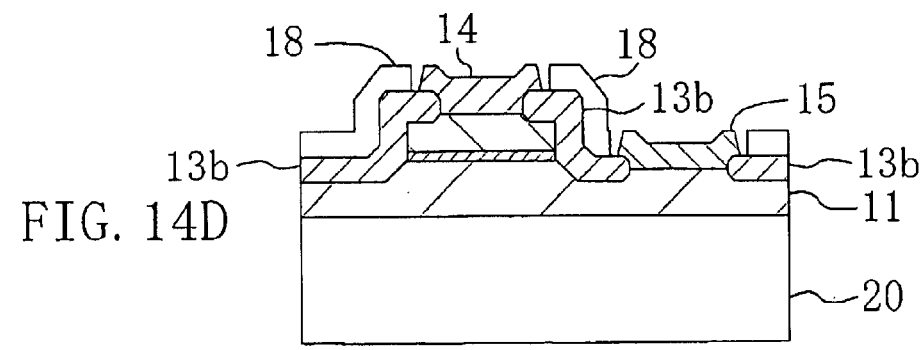

Next, as illustrated in FIG. 14D, the n-side electrode 15 made of the n-side electrode forming film 15A is formed on the first semiconductor layer 11 by a lift-off method for removing the second resist pattern 34. Note that either the p-side electrode 14 and the n-side electrode 15 may be formed first.

Thus, according to the manufacturing method of the fifth embodiment, the insulating film 18 not only functions as a surface protection film for the oxidized regions 13a, but also functions as a spacer layer, in the step of depositing the p-side electrode forming film 14A illustrated in FIG. 14B, for separating a portion of the p-side electrode forming film 14A that is located on the first resist pattern 33 and another portion thereof that is located on the second semiconductor layer 13 from each other. This is also true with the n-side electrode forming film 15A.

Therefore, in the fifth embodiment, as in the fourth embodiment, even with a structure where the current constriction section 200 is formed by dry etching, the oxidized regions 13b are formed through oxidization of the semiconductor layer itself on the side surfaces of the current constriction section 200, whereby the leakage current in the light emitting layer 12 can be reduced. As a result, it is possible to reduce the operating current of the semiconductor device.

In addition, the insulating film 18 is provided on the oxidized regions 13a, and the p-side electrode 14 and the n-side electrode 15 are formed so that the positions thereof are restricted by the insulating film 18, whereby the production yield of the electrodes 14 and 15 is improved, thus reducing the cost.

Note that while silicon oxide is used for the insulating film 18, silicon nitride ($Si_3N_4$) may alternatively be used instead of silicon oxide.

Moreover, while an MOCVD method is used as the crystal growth method for the semiconductor layers 11 and 13 including the light emitting layer 12, an MBE method may alternatively be used at least for the deposition of the light emitting layer 12.

Furthermore, a growth layer grown by an HVPE method and having a thickness of 10 μm or more, for example, may be included in at least one of the first semiconductor layer 11 and the second semiconductor layer 13.

Sixth Embodiment

The sixth embodiment of the present invention will now be described with reference to the drawings.

Figure 15:
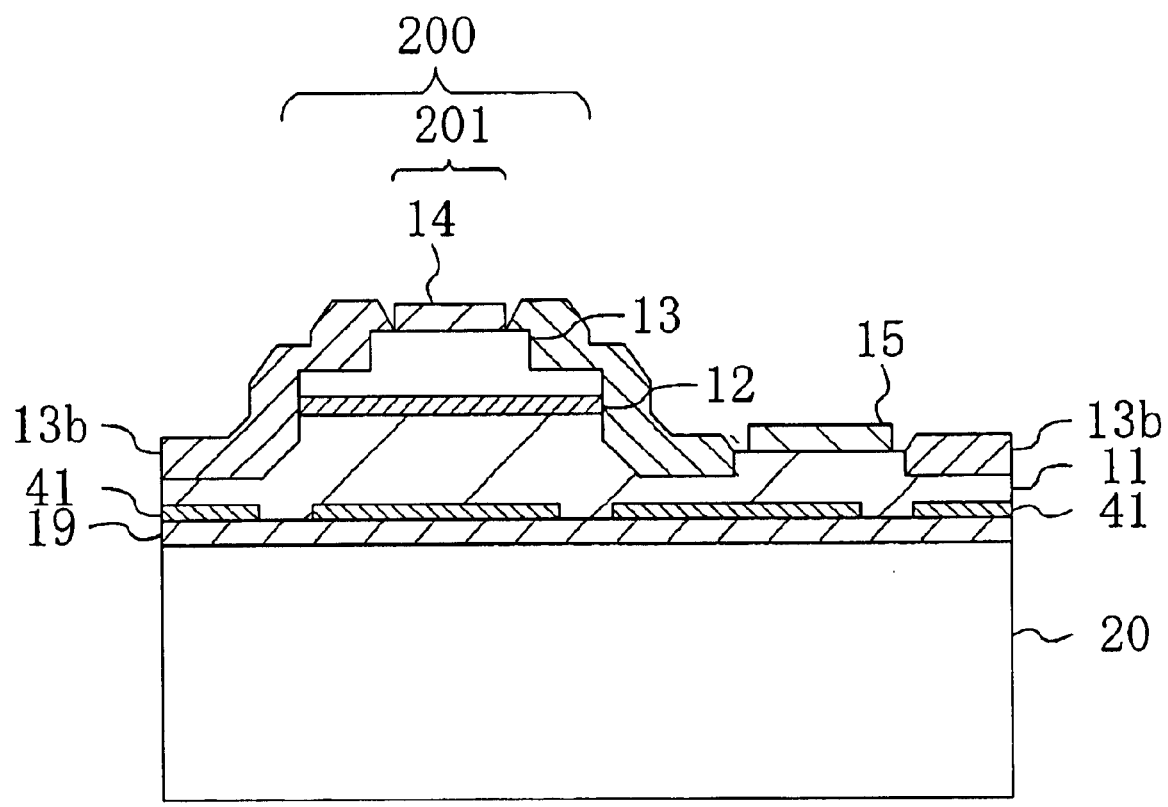
FIG. 15 is a cross-sectional view illustrating a semiconductor device according to a sixth embodiment of the present invention.

FIG. 15 is a cross-sectional view illustrating, as a semiconductor device according to the sixth embodiment of the present invention, a semiconductor light emitting device that can be applied to a semiconductor laser device. In FIG. 15, those components that are already shown in FIG. 1 are denoted by the same reference numerals, and will not be further described below.

The semiconductor device of the sixth embodiment includes: the substrate 20 made of sapphire; a base layer 19 made of n-type gallium nitride or n-type aluminum gallium nitride on the principal surface of the substrate 20; a selective growth mask layer 41 made of silicon oxide and having a stripe pattern or a dotted (island-like) pattern on the base layer 19; the first semiconductor layer 11 made of n-type aluminum gallium nitride selectively grown on the base layer 19 exposed through the openings of the selective growth mask layer 41; the light emitting layer 12 having a quantum well structure, using indium gallium nitride in the well layer, grown on the first semiconductor layer 11; and the second semiconductor layer 13 made of p-type aluminum gallium nitride grown on the light emitting layer 12. Note that the growth method for selectively growing a layer from openings of the selective growth mask layer 41 is generally called an epitaxial lateral overgrowth (ELO) method. Moreover, the base layer 19 may be undoped.

Moreover, a contact layer made of gallium nitride, for example, may be provided under each of the n-side electrode 15 and the p-side electrode 14.

The current constriction section 200, which is etched so that it has a convex cross section, is formed in the second semiconductor layer 13, the light emitting layer 12 and the first semiconductor layer 11. Furthermore, the ridge portion 201 whose width is smaller than that of the current constriction section 200 is formed in an upper portion of the second semiconductor layer 13 within the current constriction section 200. The ridge portion 201 improves the current constriction function and also functions as a waveguide. Therefore, light produced in the waveguide is confined in the ridge portion 201, thereby allowing for laser oscillation, because the refractive index of the oxidized regions 13a is smaller than those of the semiconductor layers 11 and 13.

The p-side electrode 14 as the first ohmic electrode is formed on the upper surface of the ridge portion 201, and the n-side electrode 15 as the second ohmic electrode is formed on the exposed surface of the first semiconductor layer 11 beside the current constriction section 200.

Furthermore, the sixth embodiment is characterized in that the oxidized regions 13b are formed on the exposed surfaces first semiconductor layer 11, the light emitting layer 12 and the second semiconductor layer 13, which have been exposed by dry etching, or the like. The oxidized regions 13b are formed through oxidization of the semiconductor layers 11 and 13, themselves, including the light emitting layer 12 so as to interpose the light emitting layer 12 therebetween.

Thus, according to the sixth embodiment, even with a structure where the current constriction section 200 is provided by dry etching, or the like, as in the prior art, the exposed surface of the current constriction section 200 including the side portions of the light emitting layer 12 is oxidized to form the oxidized regions 13b. Thus, even if the exposed surface of the current constriction section 200 is damaged by etching, the damaged portion is oxidized and taken into the oxidized regions 13b. As a result, the leakage current in the light emitting layer 12 is significantly reduced, whereby the threshold current value of the semiconductor laser device can be reduced.

In addition, since the first semiconductor layer 11 is formed by an ELO method, the light emitting layer 12 grown thereon has a desirable crystallinity and a reduced crystal defect density, whereby it is possible to increase the operating lifetime of the semiconductor laser device and to reduce the threshold current value thereof.

Note that the conductivity type of the first semiconductor layer 11 and that of the second semiconductor layer 13 may be switched around.

Moreover, a single-crystal substrate made of magnesium oxide or lithium gallium aluminum oxide ($LiGa_xAl_{1-x}O_2$ (where $0 \leq x \leq 1$)) may be used for the substrate 20, instead of sapphire.

A method for manufacturing a semiconductor device having such a structure will now be described with reference to the drawings.

FIG. 16A to FIG. 16D and FIG. 17A to FIG. 17C are cross-sectional views sequentially illustrating steps in a method for manufacturing a semiconductor device according to the sixth embodiment of the present invention.

Figure 16A:
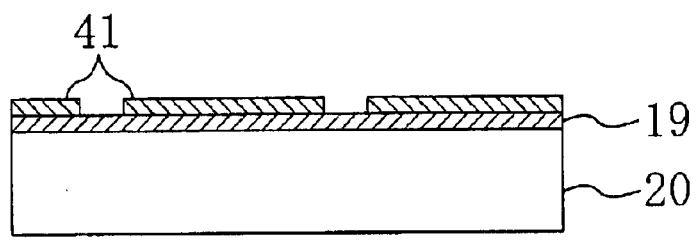
FIG. 16A to FIG. 16D are cross-sectional views sequentially illustrating steps in a method for manufacturing a semiconductor device according to the sixth embodiment of the present invention.

First, as illustrated in FIG. 16A, the base layer 19 made of n-type aluminum gallium nitride and having a thickness of about 0.5 μm is grown on the substrate 20 made of sapphire by an MOCVD method, for example. Then, a selective growth mask forming layer made of silicon oxide and having a thickness of about 200 nm is deposited on the base layer 19 by a CVD method, for example, and then the selective growth mask layer 41 having a stripe pattern is formed from the selective growth mask forming layer by a photolithography method and an etching method with hydrofluoric acid.

Figure 16B:
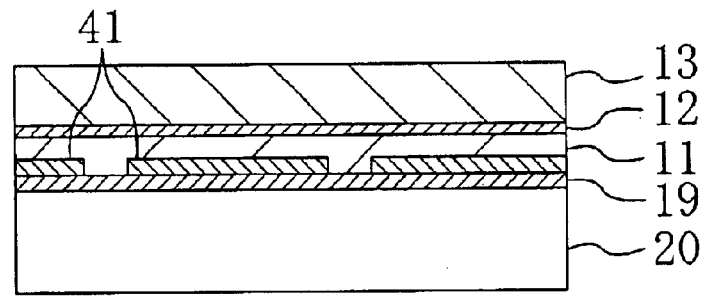

Next, as illustrated in FIG. 16B, the first semiconductor layer 11 made of n-type aluminum gallium nitride and having a thickness of about 0.5 μm is selectively grown (through an ELO process) on the exposed portions of the base layer 19 that are exposed through the selective growth mask layer 41 again by an MOCVD method. Thus, a structure in which the selective growth mask layer 41 is selectively embedded in n-type aluminum gallium nitride having a thickness of about 1 μm is obtained. Herein, the selective growth mask layer 41 may be made of any material as long as a gallium nitride semiconductor does not substantially grow thereon. In addition to silicon oxide, a preferred: insulating film material is silicon nitride, and a preferred metal material is tungsten.

Therefore, portions of the first semiconductor layer 11 that are re-grown on the selective growth mask layer 41 are grown in the direction parallel to the substrate surface (the lateral direction) without being influenced by the crystal conditions of the base layer 19. Thus, the crystallinity of the first semiconductor layer 11 is better than that of the base layer 19. For example, the crystal dislocation density, among other crystal defect densities, is on the order of $10^7$ cm$^{-2}$ for the base layer 19 and is on the order of $10^6$ cm$^{-2}$ for the first semiconductor layer 11.

Figure 16C:
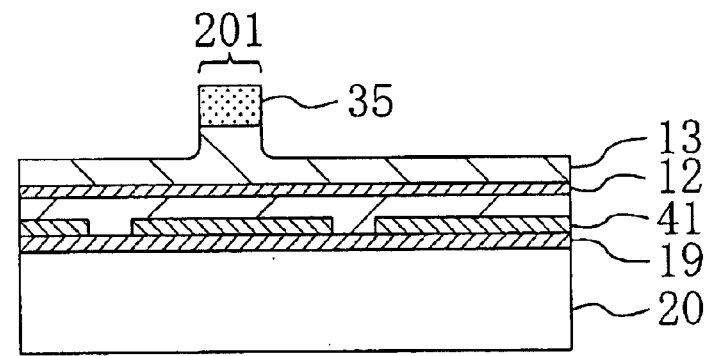

Next, as illustrated in FIG. 16C, a first resist pattern 35 is formed in a ridge portion forming region on the second semiconductor layer 13 by a photolithography method. Then, the second semiconductor layer 13 is dry-etched by an RIE method with a chlorine gas, for example, while using the formed first resist pattern 35 as a mask, thereby forming the ridge portion 201 in an upper portion of the second semiconductor layer 13.

Figure 16D:
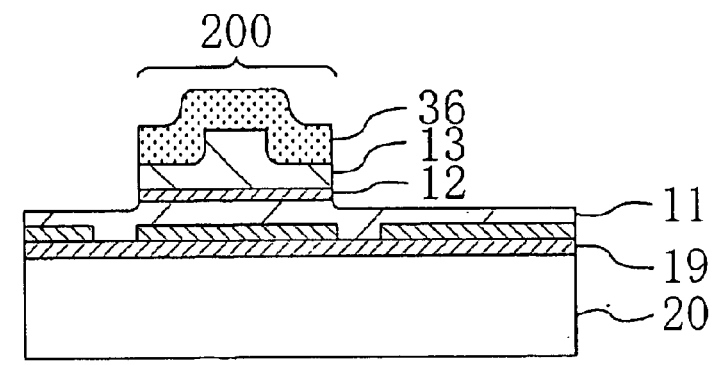

Next, as illustrated in FIG. 16D, after the first resist pattern 35 is removed, a second resist pattern 36 is formed in a current constriction section forming region including the ridge portion 201 on the second semiconductor layer 13 again by a photolithography method. Then, the second semiconductor layer 13, the light emitting layer 12 and an upper portion of the first semiconductor layer 11 are sequentially dry-etched, while using the formed second resist pattern 36 as a mask, by an RIE method using a chlorine gas, thereby forming the current constriction section 200 including the upper portion of the first semiconductor layer 11, the light emitting layer 12 and the second semiconductor layer 13.

Figure 17A:
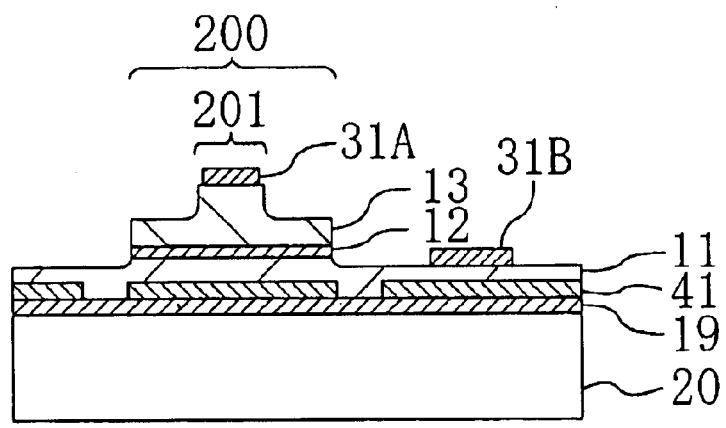
FIG. 17A to FIG. 17C are cross-sectional views sequentially illustrating steps in the method for manufacturing a semiconductor device according to the sixth embodiment of the present invention.

Next, as illustrated in FIG. 17A, a mask-forming film made of silicon is deposited across the entire upper surface of the first semiconductor layer 11 including the ridge portion 201 and the current constriction section 200 by, for example, a CVD method in which monosilane is decomposed. Then, first oxidization mask film 31A is formed, from the mask-forming film, on a portion of the second semiconductor layer 13 within the ridge portion 201 for masking the portion of the second semiconductor layer 13 excluding the peripheral portion thereof, by a photolithography method and an etching method. At the same time, a second oxidization mask film 31B is formed, from the mask-forming film, on the exposed region of the first semiconductor layer 11 beside the current constriction section 200.

Figure 17B:
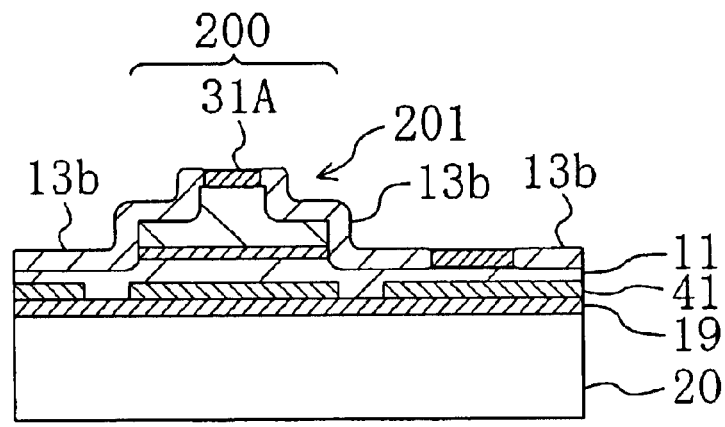

Next, as illustrated in FIG. 17B, the substrate 20 with the first oxidization mask film 31A and the second oxidization mask film 31B formed thereon is subjected to a heat treatment at a temperature of about 900° C. for about 4 hours in an oxidizing atmosphere containing an oxygen gas or water vapor. Thus, the oxidized regions 13b is formed on the surface of the current constriction section 200 and the ridge portion 201 and on the exposed surface of the first semiconductor layer 11.

Figure 17C:
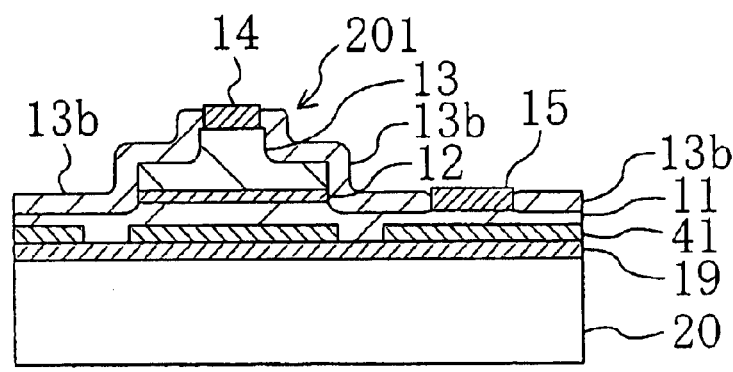

Next, as illustrated in FIG. 17C, the first oxidization mask film 31A and the second oxidization mask film 31B are removed by hydrofluoric-nitric acid, for example. Then, the p-side electrode 14 made of a nickel-gold laminate is selectively formed on a portion of the second semiconductor layer 13 that is exposed in the ridge portion 201 by an electron beam deposition method, or the like. Then, the n-side electrode 15 made of a titanium-aluminum laminate is formed on the exposed region of the first semiconductor layer 11. Again, the p-side electrode 14 and the n-side electrode 15 may be formed in any order.

Note that the substrate 20 may be separated from the base layer 19 by irradiating one surface of the substrate 20 that is away from the base layer 19 with KrF excimer laser light, or the like.

Furthermore, the base layer 19 and the selective growth mask layer 41 may be removed by polishing.

Moreover, the separation of the substrate 20 may be done after bonding a support substrate made of silicon oriented along the (100) plane or copper.

Moreover, while an MOCVD method is used as the crystal growth method for the semiconductor layers 11 and 13 including the light emitting layer 12, an MBE method may alternatively be used at least for the deposition of the light emitting layer 12.

Furthermore, a growth layer grown by an HVPE method and having a thickness of 10 μm or more, for example, may be included in at least one of the first semiconductor layer 11 and the second semiconductor layer 13.

Seventh Embodiment

The seventh embodiment of the present invention will now be described with reference to the drawings.

Figure 18:
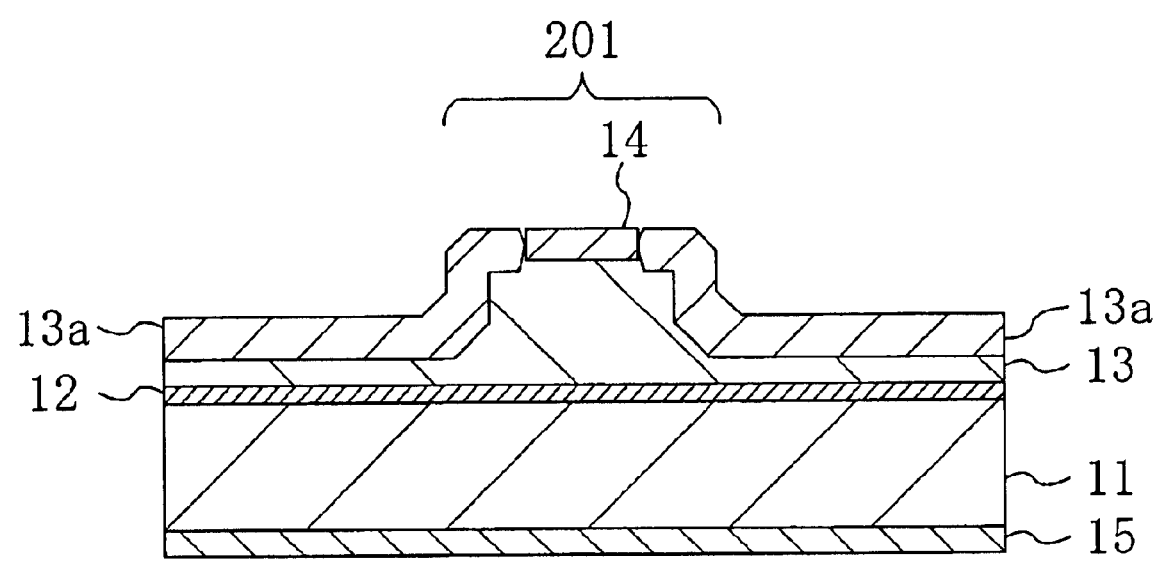
FIG. 18 is a cross-sectional view illustrating a semiconductor device according to a seventh embodiment of the present invention.

FIG. 18 is a cross-sectional view illustrating, as a semiconductor device according to the seventh embodiment of the present invention, a semiconductor light emitting device that can be applied to a semiconductor laser device. In FIG. 18, those components that are already shown in FIG. 1 are denoted by the same reference numerals, and will not be further described below.

In the semiconductor device according to the seventh embodiment, the ridge portion 201 having a convex cross section is selectively provided in the p-type second semiconductor layer 13. The oxidized regions 13a are formed through oxidization of the second semiconductor layer 13 itself on the exposed surface of the ridge portion 201. Thus, the oxidized regions 13a are formed so as to be spaced apart from each other in the direction parallel to the plane of the light emitting layer 12.

As described above, the ridge portion 201 functions not only as a current constriction section but also as a waveguide, whereby light produced in the waveguide is confined in the ridge portion 201, thereby allowing for laser oscillation, because the refractive index of the oxidized regions 13a is smaller than those of the semiconductor layers 11 and 13.

Moreover, the device does not have a substrate for growing semiconductor layers thereon, whereby the p-side electrode 14 and the n-side electrode 15 are formed so as to oppose each other via the light emitting layer 12 having a quantum well structure therebetween.

Therefore, in the seventh embodiment, since the p-side electrode 14 and the n-side electrode 15 oppose each other, the series resistance value of the p-n junction is reduced.

Moreover, even with a structure where the ridge portion 201 is provided by dry etching, or the like, as in the prior art, the exposed surface of the second semiconductor layer 13 in the ridge portion 201 is oxidized to form the oxidized regions 13a. Thus, even if the exposed surface of the ridge portion 201 is damaged by etching, the damaged portion is oxidized and taken into the oxidized regions 13a. As a result, the leakage current in the light emitting layer 12 is significantly reduced, whereby the threshold current value of the semiconductor laser device can be reduced.

Moreover, it is required to perform a dry etching step for the second semiconductor layer 13 only once, i.e., when forming the ridge portion 201, whereby the process can be simplified.

Note that the conductivity type of the first semiconductor layer 11 and that of the second semiconductor layer 13 may be switched around.

A method for manufacturing a semiconductor device having such a structure will now be described with reference to the drawings.

FIG. 19A to FIG. 19D and FIG. 20A to FIG. 20C are cross-sectional views sequentially illustrating steps in a method for manufacturing a semiconductor device according to the seventh embodiment of the present invention.

Figure 19A:
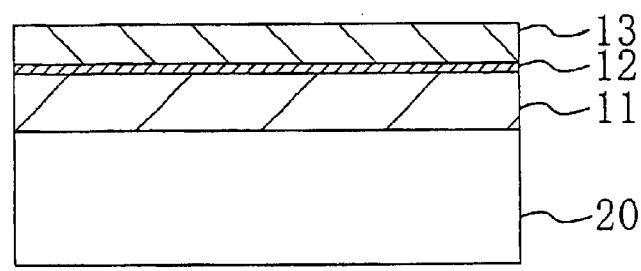
FIG. 19A to FIG. 19D are cross-sectional views sequentially illustrating steps in a method for manufacturing a semiconductor device according to the seventh embodiment of the present invention.

First, as illustrated in FIG. 19A, the first semiconductor layer 11 made of n-type aluminum gallium nitride; the light emitting layer 12 including indium gallium nitride in the well layer, and the second semiconductor layer 13 made of p-type aluminum gallium nitride are grown in this order on the substrate 20 made of sapphire by an MOCVD method, for example. Herein, a portion of the first semiconductor layer 11 in the vicinity of the interface with the substrate 20 may be made of gallium nitride. Similarly, a portion of the second semiconductor layer 13 in the vicinity of the upper surface thereof may be made of gallium nitride.

Figure 19B:
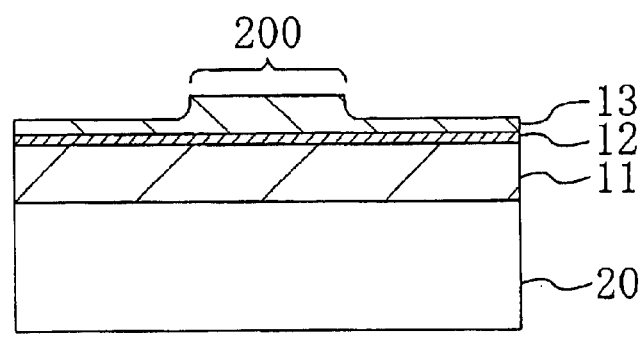

Next, as illustrated in FIG. 19B, the second semiconductor layer 13 is dry-etched, while masking a ridge portion forming region of the second semiconductor layer 13, by an RIE method using a chlorine gas as an etching gas, for example, thereby forming the ridge portion 201 having a planar stripe pattern and a convex cross section in the second semiconductor layer 13.

Figure 19C:
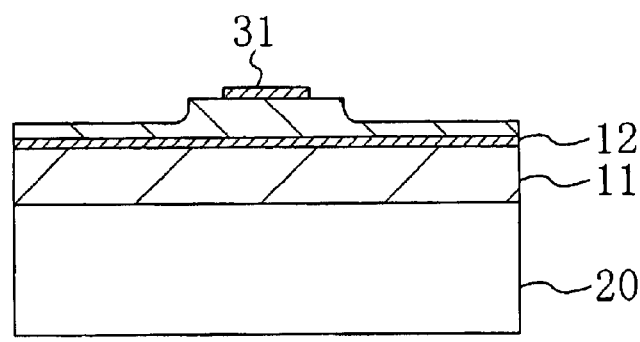

Next, as illustrated in FIG. 19C, a mask-forming film made of silicon is deposited across the entire upper surface of the second semiconductor layer 13 including the ridge portion 201 by a CVD method, for example, and then the oxidization mask film 31 is formed, from the mask-forming film, on a portion of the second semiconductor layer 13 within the ridge portion 201 for masking the portion of the second semiconductor layer 13 excluding the peripheral portion thereof, by a photolithography method and an etching method.

Herein, in the step illustrated in FIG. 19B, if the etching process is performed by using the oxidization mask film 31 as a mask, instead of using a resist mask, or the like, the photolithography step illustrated in FIG. 19B can be omitted.

Figure 19D:
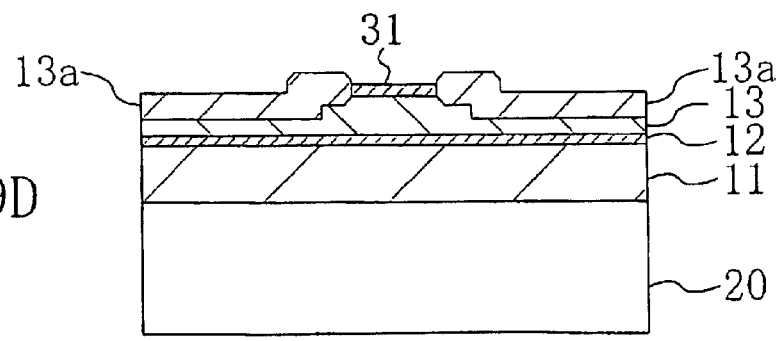

Next, as illustrated in FIG. 19D, the second semiconductor layer 13 with the oxidization mask film 31 formed thereon is subjected to a heat treatment at a temperature of about 900° C. for about 4 hours in an oxidizing atmosphere containing an oxygen gas or water vapor. Thus, the oxidized regions 13a are formed on the exposed surface of the second semiconductor layer 13.

Figure 20A:
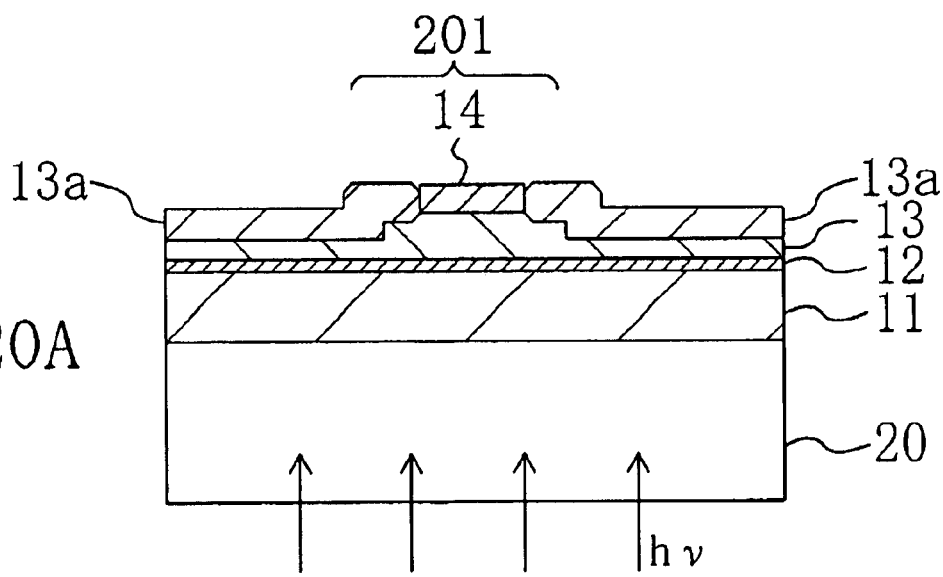
FIG. 20A to FIG. 20C are cross-sectional views sequentially illustrating steps in the method for manufacturing a semiconductor device according to the seventh embodiment of the present invention.
Figure 20B:
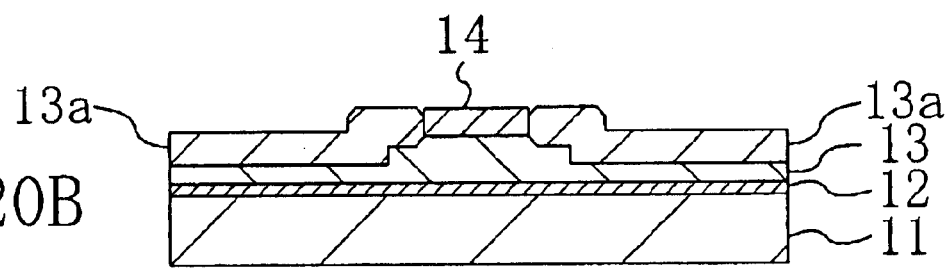

Next, as illustrated in FIG. 20A, the oxidization mask film 31 is removed by hydrofluoric-nitric acid, for example. Then, the p-side electrode 14 made of a nickel-gold laminate is selectively formed on a portion of the second semiconductor layer 13 that is exposed in the ridge portion 201 between the oxidized regions 13a by an electron beam deposition method, or the like. Then, one surface of the substrate 20 that is away from the first semiconductor layer 11 is irradiated with pulsed KrF excimer laser light so as to scan the entire surface of the substrate 20. The irradiation with laser light thermally decomposes a portion of the first semiconductor layer 11 that is along the interface with the substrate 20, thereby separating the substrate 20 and the first semiconductor layer 11 from each other, as illustrated in FIG. 20B. Herein, the substrate 20 may be heated to a temperature of about 500° C. while being irradiated with the laser light. Moreover, the means for separating or removing the substrate 20 may alternatively be the tertiary harmonic wave of YAG laser, the emission line of a mercury lamp, or a polishing method.

Figure 20C:
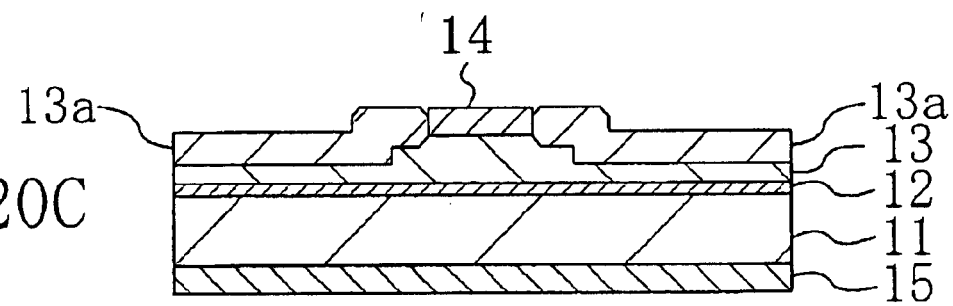
Figure 21:
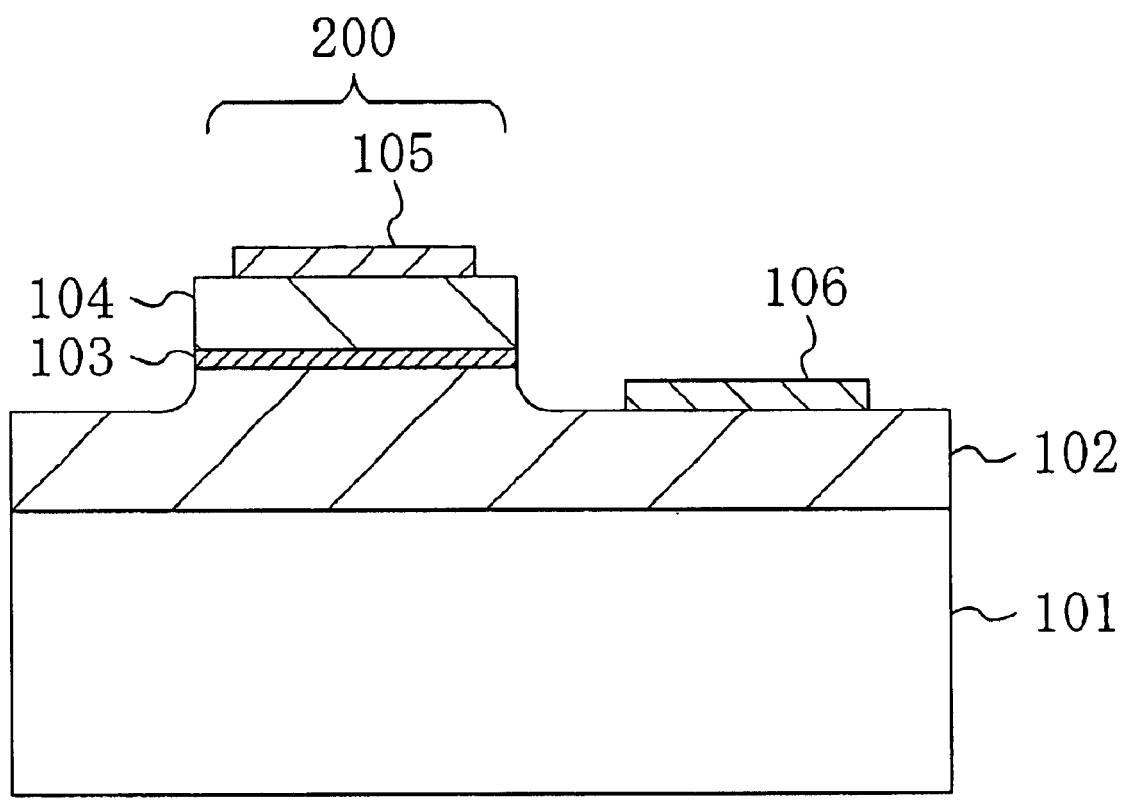
FIG. 21 is a cross-sectional view illustrating a light emitting diode device according to a first conventional example.
Figure 22:
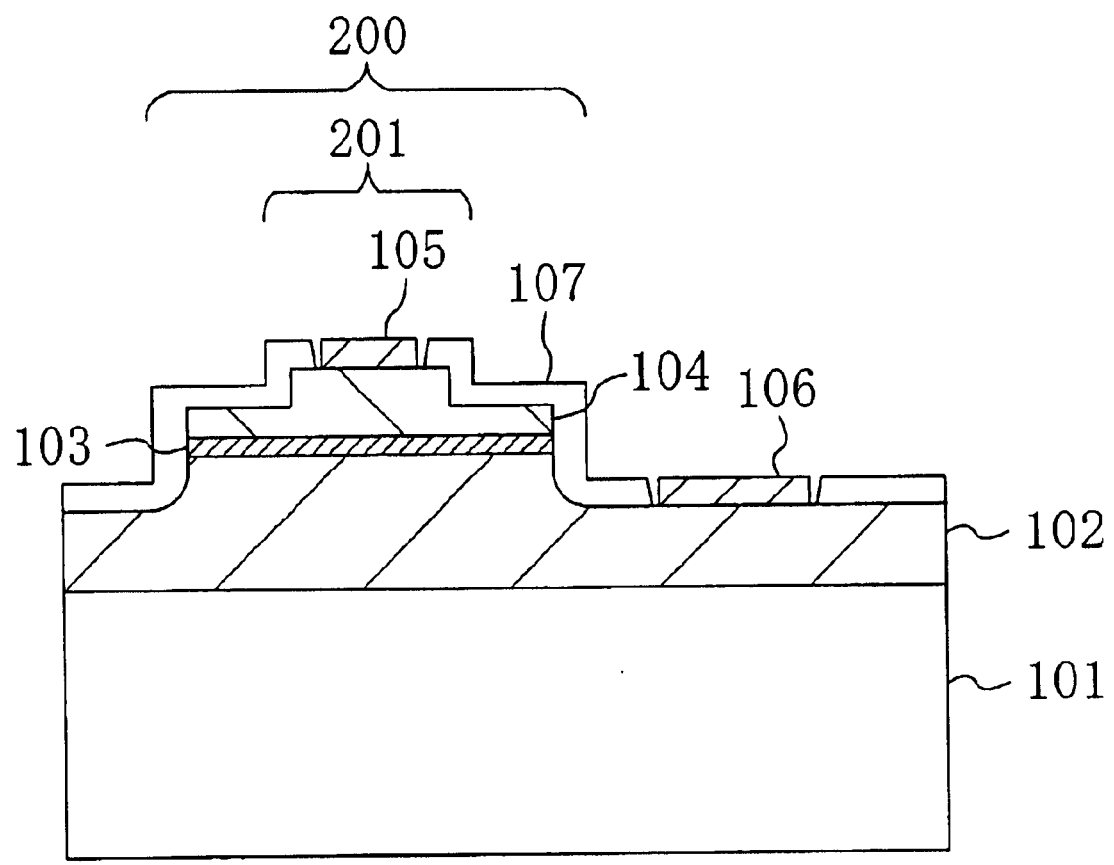
FIG. 22 is a cross-sectional view illustrating a semiconductor laser device according to a second conventional example.

Next, as illustrated in FIG. 20C, the n-side electrode 15 made of a titanium-aluminum laminate is formed through a vapor deposition process on one surface of the first semiconductor layer 11 that is away from the light emitting layer 12. Then, the semiconductor layers 11 and 13 including the light emitting layer 12, on which the electrodes 14 and 15 have been formed, are cleaved so as to form a cavity for oscillating laser light. At this time, since the substrate 20 has been removed, the semiconductor layers 11 and 13 including the light emitting layer 12 can be cleaved in the orientation that is inherent to a gallium nitride semiconductor without being bound by the orientation of sapphire. As a result, a cavity having a desirable cleaved surface can be obtained, whereby improvements in the operating characteristics of the device can be achieved, such as a reduction in the threshold current value.

Note that while an MOCVD method is used as the crystal growth method for the semiconductor layers 11 and 13 including the light emitting layer 12, an MBE method may alternatively be used at least for the deposition of the light emitting layer 12.

Furthermore, a growth layer grown by an HVPE method and having a thickness of 10 μm or more, for example, may be included in at least one of the first semiconductor layer 11 and the second semiconductor layer 13.

Moreover, a conductive material such as silicon carbide may alternatively be used for the substrate 20, instead of using an insulating material such as sapphire. In this way, the need for the step of removing the substrate 20 is eliminated.

Moreover, a support substrate made of a conductive material such as silicon may be bonded to one surface of the first semiconductor layer 11 that is away from the light emitting layer 12 after the separation of the substrate 20 and before the formation of the n-side electrode 15.

Moreover, the orientation of the principal surface of the substrate 20 or 21 of any of the embodiments and the variations thereof described above is not limited to any particular orientation. For example, it may of course be the (0001) orientation, which is the typical orientation with sapphire and silicon carbide, but the principal surface may be provided with a so-called "off-angle" by offsetting it slightly from the (0001) plane.

Moreover, while an ELO method is used in the sixth embodiment, it may also be used in other embodiments or variations thereof.

Moreover, while the semiconductor devices of the embodiments described above take a so-called "pin junction structure" in which the undoped light emitting layer 12 is provided between the n-type first semiconductor layer 11 and the p-type second semiconductor layer 13, the structure is not limited to a pin junction structure. Particularly, when the present invention is applied to a light emitting diode device, it may take a p-n junction structure made of the first semiconductor layer 11 and the second semiconductor layer 13.

Moreover, the material of the first semiconductor layer 11, the light emitting layer 12 and the second semiconductor layer 13 is not limited to a group III-V nitride semiconductor.

What is claimed is:

1. A method for manufacturing a semiconductor device, comprising:

a first step of forming a portion of a first semiconductor layer of a first conductivity type;

a second step of selectively oxidizing the portion of the first semiconductor layer, thereby forming, in the portion of the first semiconductor layer, oxidized regions spaced apart from each other in a direction parallel to a plane of the first semiconductor layer;

a third step of forming a rest of the first semiconductor layer on the portion of the first semiconductor layer including the oxidized regions; and a fourth step of forming a second semiconductor layer of a second conductivity type on the first semiconductor layer, thereby forming an active region between the first semiconductor layer and the second semiconductor layer.

2. The method for manufacturing a semiconductor device of claim 1, wherein the second step includes a step of selectively covering an upper surface of the portion of the first semiconductor layer by a mask film made of a material that is less likely to be oxidized than the first semiconductor layer.

3. The method for manufacturing a semiconductor device of claim 2, further comprising:

a fifth step of removing the mask film, between the second step and the third step; and a sixth step of forming ohmic electrode on the second semiconductor layer, after the fourth step.

4. The method for manufacturing a semiconductor device of claim 1, further comprising, after the fourth step:

a fifth step of forming a first ohmic electrode on the second semiconductor layer; and a sixth step of forming a second ohmic electrode on one surface of the first semiconductor layer that is away from the active region.

5. The method for manufacturing a semiconductor device of claim 1, wherein:

in the first step, the portion of the first semiconductor layer is formed on a substrate; and the method further comprises, after the fourth step, a step of separating the substrate from the first semiconductor layer.

6. The method for manufacturing a semiconductor device of claim 5, wherein the substrate is made of sapphire, silicon carbide, silicon, gallium arsenide, gallium phosphide, indium phosphide, magnesium oxide, zinc oxide or lithium gallium aluminum oxide ($LiGa_xAl_{1-x}O_2$ (where $0 \leq x \leq 1$)).

7. The method for manufacturing a semiconductor device of claim 5, wherein the substrate separation step includes a step of bonding a support substrate for supporting the second semiconductor layer to an upper surface of the second semiconductor layer.

8. The method for manufacturing a semiconductor device of claim 7, further comprising, after the substrate separation step, a step of forming an ohmic electrode on the support substrate.

9. The method for manufacturing a semiconductor device of claim 7, wherein the support substrate is made of silicon, gallium arsenide, gallium phosphide, indium phosphide or a metal.

10. The method for manufacturing a semiconductor device of claim 5, wherein the substrate separation step is performed by a polishing method.

11. The method for manufacturing a semiconductor device of claim 5, wherein:

the substrate is made of a material whose forbidden band width is larger than that of the first semiconductor layer;

the substrate separation step includes a step of irradiating the first semiconductor layer with irradiation light from one surface of the substrate that is away from the first semiconductor layer; and an energy of the irradiation light is smaller than the forbidden band width of the substrate and larger than that of the first semiconductor layer.

12. The method for manufacturing a semiconductor device of claim 11, wherein the irradiation light is laser light that oscillates in a pulsed manner.

13. The method for manufacturing a semiconductor device of claim 11, wherein the irradiation light is an emission line of a mercury lamp.

14. The method for manufacturing a semiconductor device of claim 11, wherein the substrate separation step includes a step of heating the substrate.

15. The method for manufacturing a semiconductor device of claim 11, wherein in the substrate separation step, the irradiation light is radiated so as to scan a surface of the substrate.

16. The method for manufacturing a semiconductor device of claim 5, wherein:

the first semiconductor layer is made of a plurality of semiconductor layers having different compositions;

the substrate is made of a material whose forbidden band width is larger than a forbidden band width of one of the plurality of semiconductor layers that has a smallest forbidden band width;

the substrate separation step includes a step of irradiating the first semiconductor layer with irradiation light from one surface of the substrate that is away from the first semiconductor layer; and an energy of the irradiation light is smaller than the forbidden band width of the substrate and larger than the forbidden band width of one of the plurality of semiconductor layers that has the smallest forbidden band width.

17. The method for manufacturing a semiconductor device of claim 16, wherein the irradiation light is laser light that oscillates in a pulsed manner.

18. The method for manufacturing a semiconductor device of claim 16, wherein the irradiation light is an emission line of a mercury lamp.

19. The method for manufacturing a semiconductor device of claim 16, wherein the substrate separation step includes a step of heating the substrate.

20. The method for manufacturing a semiconductor device of claim 16, wherein in the substrate separation step, the irradiation light is radiated so as to scan a surface of the substrate.

21. The method for manufacturing a semiconductor device of claim 1, wherein in the second step, the oxidization is performed in an atmosphere containing an oxygen gas or water vapor.

22. The method for manufacturing a semiconductor device of claim 1, wherein the first semiconductor layer and the second semiconductor layer are deposited by using one of a metal organic chemical vapor deposition method, a molecular beam epitaxy method and a hydride vapor phase epitaxy method, or by using more than one of the methods in combination.

23. The method for manufacturing a semiconductor device of claim 1, wherein the first semiconductor layer and the second semiconductor layer are made of a compound semiconductor containing nitrogen.

* * * * *